(12) United States Patent
Nakazawa et al.

(10) Patent No.: US 12,142,658 B2
(45) Date of Patent: Nov. 12, 2024

(54) SEMICONDUCTOR DEVICE

(71) Applicant: Semiconductor Energy Laboratory Co., Ltd., Atsugi (JP)

(72) Inventors: Yasutaka Nakazawa, Tochigi (JP); Kenichi Okazaki, Tochigi (JP); Takayuki Ohide, Tochigi (JP); Rai Sato, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/747,063

(22) Filed: May 18, 2022

(65) Prior Publication Data

US 2023/0197824 A1   Jun. 22, 2023

Related U.S. Application Data

(63) Continuation of application No. 16/966,066, filed as application No. PCT/IB2019/051279 on Feb. 18, 2019, now Pat. No. 11,349,006.

(30) Foreign Application Priority Data

Mar. 2, 2018   (JP) ................................ 2018-037230

(51) Int. Cl.
    *H01L 29/66*      (2006.01)
    *H01L 27/12*      (2006.01)
    (Continued)

(52) U.S. Cl.
    CPC .......... *H01L 29/45* (2013.01); *H01L 27/1225* (2013.01); *H01L 27/127* (2013.01);
    (Continued)

(58) Field of Classification Search
    CPC .............. H01L 27/1225; H01L 27/127; H01L 27/1288; H01L 29/45; H01L 29/66969;
    (Continued)

(56) References Cited

U.S. PATENT DOCUMENTS 8,129,717 B2 *  3/2012  Yamazaki ........... H01L 27/1225
                                                 257/E29.096
8,242,494 B2    8/2012  Suzawa et al.
                (Continued)

FOREIGN PATENT DOCUMENTS

CN    101728278 A    6/2010
CN    101789402 A    7/2010
                (Continued)

OTHER PUBLICATIONS

Macine translation of WO2019/123109.*
                (Continued)

*Primary Examiner* — Nikolay K Yushin
(74) *Attorney, Agent, or Firm* — Eric J. Robinson; Robinson Intellectual Property Law Office, P.C.

(57) ABSTRACT

A semiconductor device is fabricated by a method including the following steps: a first step of forming a semiconductor film containing a metal oxide over an insulating layer; a second step of forming a conductive film over the semiconductor film; a third step of forming a first resist mask over the conductive film and etching the conductive film to form a first conductive layer and to expose a top surface of the semiconductor film that is not covered with the first conductive layer; and a fourth step of forming a second resist mask that covers a top surface and a side surface of the first conductive layer and part of the top surface of the semiconductor film and etching the semiconductor film to form a semiconductor layer and to expose a top surface of the insulating layer that is not covered with the semiconductor layer.

6 Claims, 20 Drawing Sheets

(51) Int. Cl.
*H01L 29/45* (2006.01)
*H01L 29/786* (2006.01)
*G02F 1/1368* (2006.01)
*H10K 59/121* (2023.01)

(52) U.S. Cl.
CPC .... *H01L 27/1288* (2013.01); *H01L 29/66969* (2013.01); *H01L 29/7869* (2013.01); *H01L 29/78696* (2013.01); *G02F 1/1368* (2013.01); *H10K 59/1213* (2023.02)

(58) Field of Classification Search
CPC ........... H01L 29/7869; H01L 29/78696; H01L 29/78648; H01L 27/12; H01L 29/66; H01L 29/78612; H01L 29/78621; H01L 29/786; H10K 59/1213; H10K 59/1231; H10K 59/123; H10K 59/126; H10K 59/00; H10K 50/00; H10K 50/844; H10K 50/805; H10K 59/121; H10K 59/82; G02F 1/1368; G02F 1/13439; G02F 1/136227; G02F 1/13394; G02F 1/134309; G02F 1/1343; G09F 9/30; G09F 9/00; G09F 9/37
See application file for complete search history.

(56) References Cited

U.S. PATENT DOCUMENTS

| | | |
|---|---|---|
| 8,343,817 B2 | 1/2013 | Miyairi et al. |
| 8,536,571 B2 | 9/2013 | Yamazaki |
| 8,610,871 B2 | 12/2013 | Tanaka. et al. |
| 8,686,417 B2 | 4/2014 | Suzawa et al. |
| 8,729,547 B2 | 5/2014 | Miyairi et al. |
| 8,921,948 B2 | 12/2014 | Yamazaki |
| 8,946,703 B2 | 2/2015 | Miyairi et al. |
| 8,980,685 B2 | 3/2015 | Suzawa et al. |
| 9,082,857 B2 | 7/2015 | Yamazaki et al. |
| 9,166,026 B2 | 10/2015 | Yamazaki |
| 9,166,058 B2 | 10/2015 | Miyairi et al. |
| 9,236,456 B2 | 1/2016 | Miyairi et al. |
| 9,252,226 B2 | 2/2016 | Kim et al. |
| 9,397,194 B2 | 7/2016 | Yamazaki et al. |
| 9,418,594 B2 | 8/2016 | Ono et al. |
| 9,437,743 B2 | 9/2016 | Mizoguchi et al. |
| 9,437,748 B2 | 9/2016 | Miyairi et al. |
| 9,496,408 B2 | 11/2016 | Yamazaki et al. |
| 9,570,484 B2 | 2/2017 | Yamazaki |
| 9,589,998 B2 | 3/2017 | Kim et al. |
| 9,741,865 B2 | 8/2017 | Yamazaki et al. |
| 9,793,416 B2 | 10/2017 | Miyairi et al. |
| 9,837,446 B2 | 12/2017 | Kim et al. |
| 9,859,437 B2 | 1/2018 | Morosawa et al. |
| 9,880,436 B2* | 1/2018 | Tsuda .................. G02F 1/13439 |
| 9,899,536 B2 | 2/2018 | Yamazaki et al. |
| 9,917,197 B2 | 3/2018 | Mizoguchi et al. |
| 10,128,381 B2 | 11/2018 | Yamazaki et al. |
| 10,205,030 B2 | 2/2019 | Miyairi et al. |
| 10,504,924 B2 | 12/2019 | Yamazaki et al. |
| 10,763,371 B2 | 9/2020 | Morosawa et al. |
| 2010/0025678 A1* | 2/2010 | Yamazaki ............... H01L 21/46 257/E21.414 |
| 2010/0051940 A1 | 3/2010 | Yamazaki et al. |
| 2010/0051949 A1 | 3/2010 | Yamazaki et al. |
| 2012/0086000 A1 | 4/2012 | Mizoguchi et al. |
| 2012/0175610 A1 | 7/2012 | Yamazaki |
| 2013/0032793 A1 | 2/2013 | Kim et al. |
| 2015/0070253 A1 | 3/2015 | Ono et al. |
| 2016/0163866 A1 | 6/2016 | Kim et al. |
| 2017/0323908 A1 | 11/2017 | Yamazaki et al. |

FOREIGN PATENT DOCUMENTS

| | | | |
|---|---|---|---|
| CN | 101882630 A | 11/2010 | |
| CN | 102593186 A | 7/2012 | |
| CN | 102916016 A | 2/2013 | |
| CN | 107359202 A | 11/2017 | |
| EP | 2159845 A | 3/2010 | |
| JP | 2010-080952 A | 4/2010 | |
| JP | 2011-228622 A | 11/2011 | |
| JP | 2012-099796 A | 5/2012 | |
| JP | 2012-160717 A | 8/2012 | |
| JP | 2012-160719 A | 8/2012 | |
| JP | 2013-033927 A | 2/2013 | |
| JP | 2014-007399 A | 1/2014 | |
| JP | 2015-072448 A | 4/2015 | |
| JP | 2017-204641 A | 11/2017 | |
| KR | 2010-0019381 A | 2/2010 | |
| KR | 2010-0027067 A | 3/2010 | |
| KR | 2012-0036269 A | 4/2012 | |
| KR | 2012-0090784 A | 8/2012 | |
| KR | 2013-0015170 A | 2/2013 | |
| KR | 2017-0126398 A | 11/2017 | |
| TW | 201029184 | 8/2010 | |
| TW | 201218282 | 5/2012 | |
| TW | 201234483 | 8/2012 | |
| WO | WO2019/123109 | * 6/2019 | ........... H01L 21/336 |

OTHER PUBLICATIONS

International Search Report (Application No. PCT/IB2019/051279) Dated May 28, 2019.
Written Opinion (Application No. PCT/IB2019/051279) Dated May 28, 2019.
Chinese Office Action (Application No. 201980014757.7), dated Oct. 14, 2023.
Taiwanese Office Action (Application No. 112114794), dated Nov. 6, 2023.

* cited by examiner

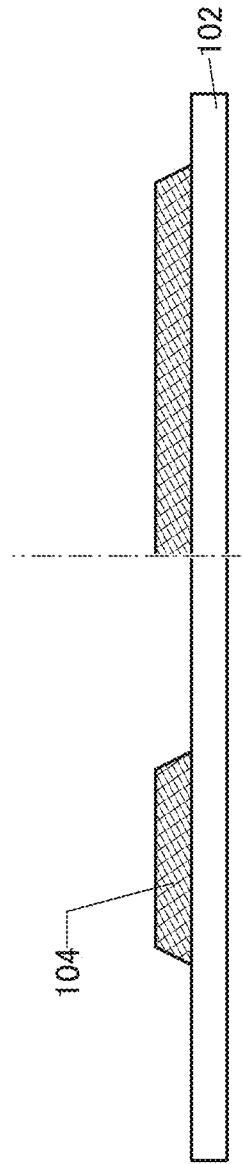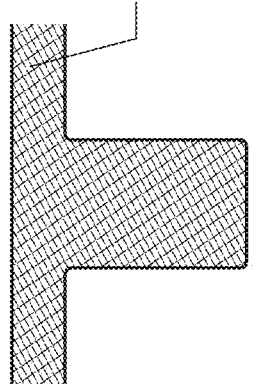
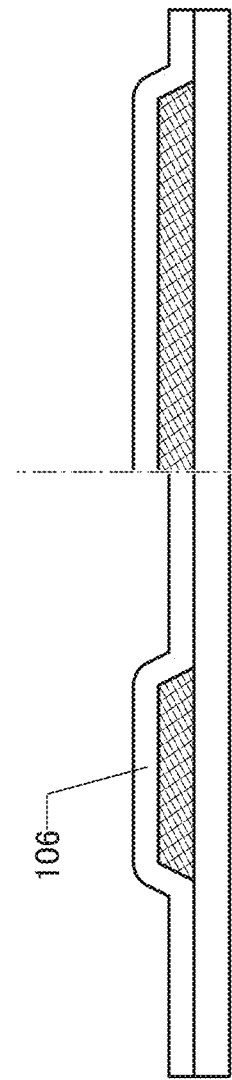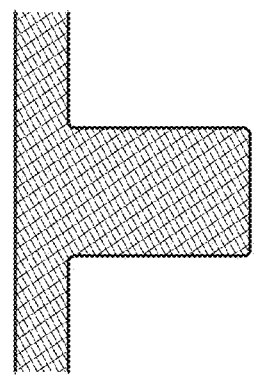
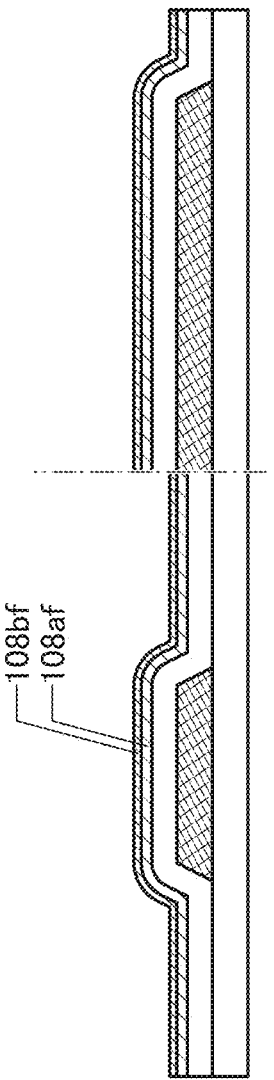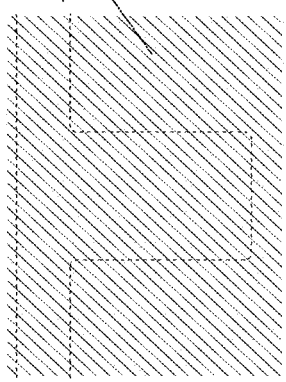

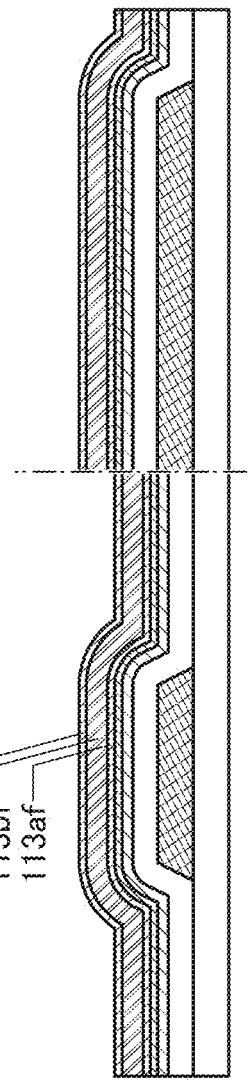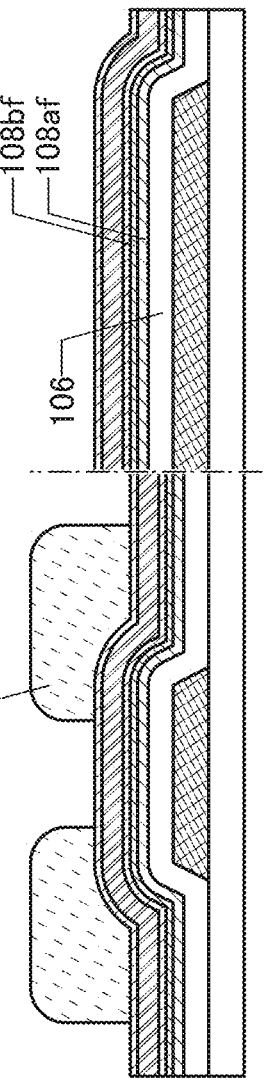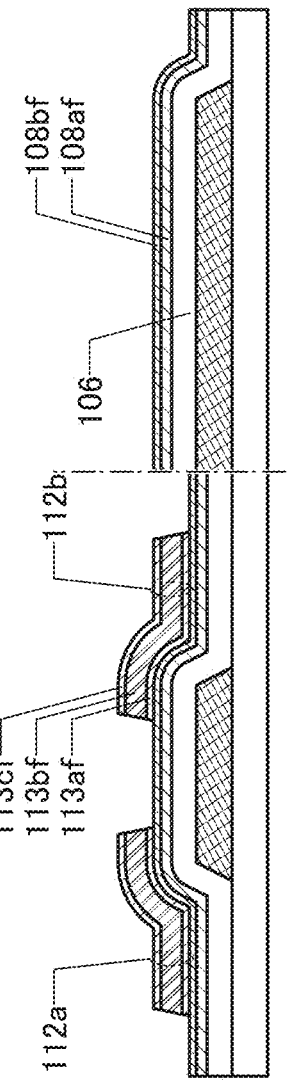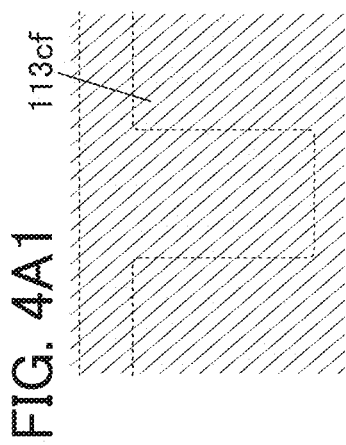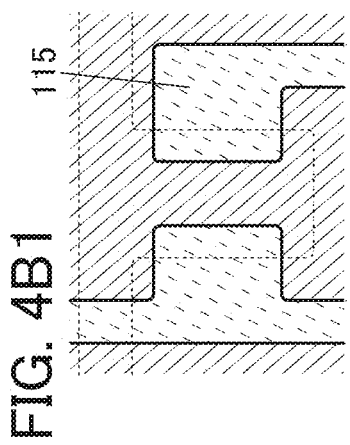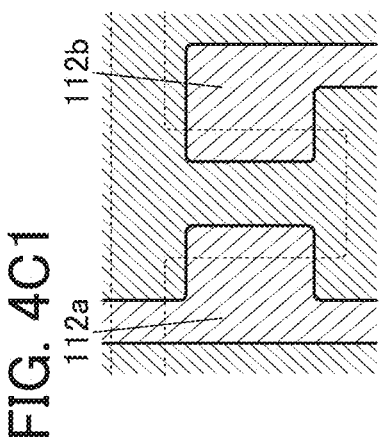

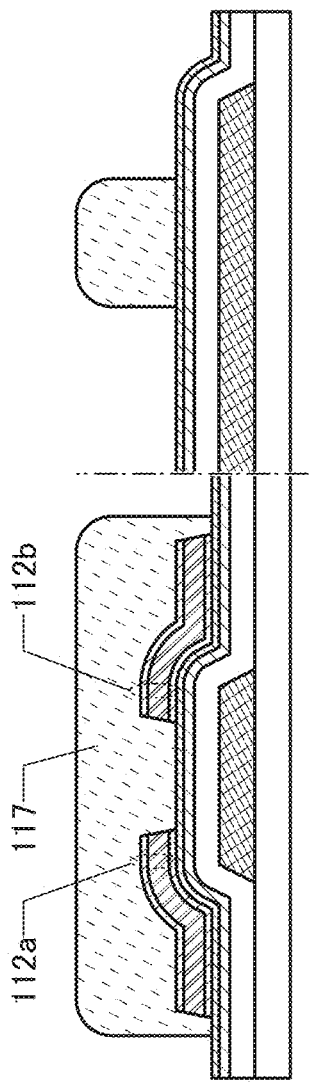
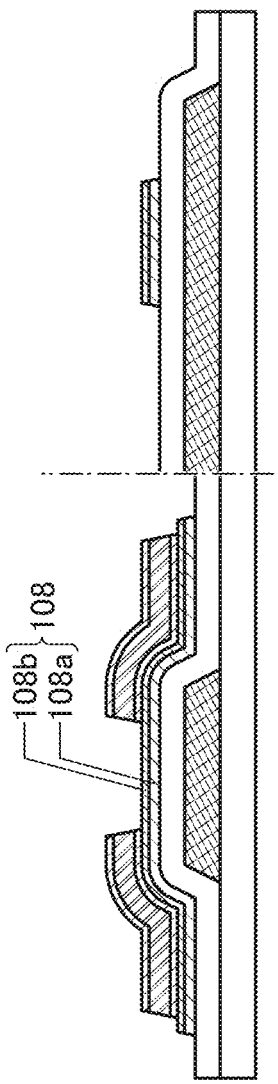
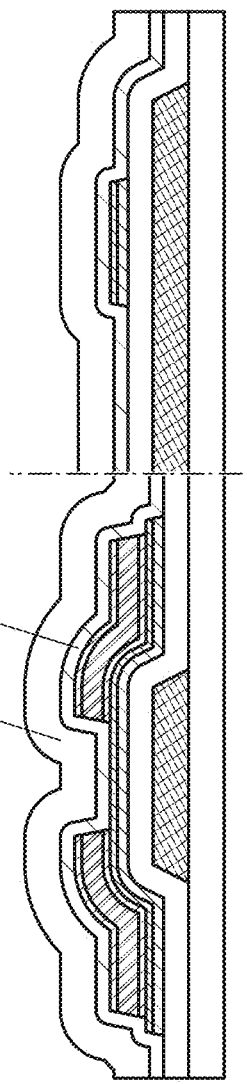
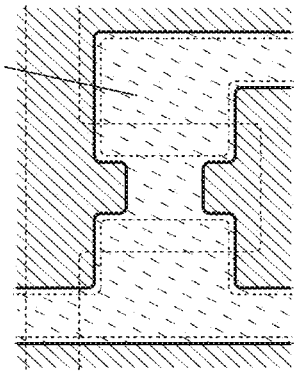
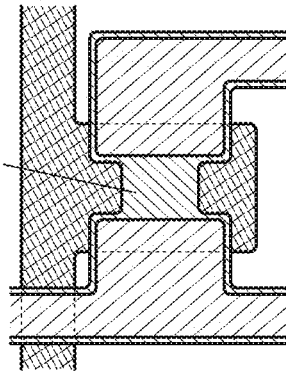
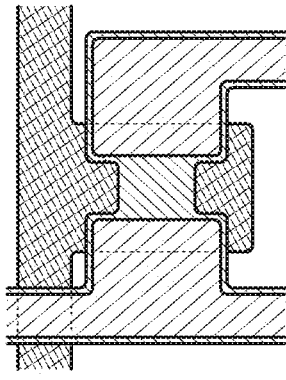
FIG. 5A2  FIG. 5B2  FIG. 5C2
FIG. 5A1  FIG. 5B1  FIG. 5C1

SEMICONDUCTOR DEVICE

TECHNICAL FIELD

One embodiment of the present invention relates to a semiconductor device and a fabrication method of the semiconductor device. One embodiment of the present invention relates to a transistor and a fabrication method of the transistor. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a fabrication method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or $\mu FE$ in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; thus, a high-performance display device provided with driver circuits can be obtained.

Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is used for a source region and a drain region.

REFERENCES

Patent Documents

[Patent Document 1] Japanese Published Patent Application No. 2014-7399
[Patent Document 2] Japanese Published Patent Application No. 2011-228622
[Patent Document 3] Japanese Published Patent Application No. 2012-160717

SUMMARY OF THE INVENTION

Problems to be Solved by the Invention

One object of one embodiment of the present invention is to provide a semiconductor device having good electrical characteristics and a fabrication method thereof. Another object is to provide a semiconductor device having stable electrical characteristics and a fabrication method thereof. Another object of one embodiment of the present invention is to provide a highly reliable display device.

Note that the description of these objects does not preclude the existence of other objects. One embodiment of the present invention does not have to achieve all the objects. Note that objects other than them can be derived from the description of the specification, the drawings, the claims, and the like.

Means for Solving the Problems

One embodiment of the present invention is a method for fabricating a semiconductor device, including a first step of forming a semiconductor film containing a metal oxide over an insulating layer, a second step of forming a conductive film over the semiconductor film, a third step of forming a first resist mask over the conductive film and etching the conductive film to form a first conductive layer and to expose a top surface of the semiconductor film that is not covered with the first conductive layer, and a fourth step of forming a second resist mask that covers a top surface and a side surface of the first conductive layer and part of the top surface of the semiconductor film and etching the semiconductor film to form a semiconductor layer and to expose a top surface of the insulating layer that is not covered with the semiconductor layer.

The conductive film preferably contains copper or aluminum.

Another embodiment of the present invention is a method for fabricating a semiconductor device, including a first step of forming a semiconductor film containing a metal oxide over an insulating layer, a second step of forming a first conductive film, a second conductive film, and a third conductive film in this order over the semiconductor film, a third step of forming a first resist mask over the third conductive film and etching the third conductive film, the second conductive film, and the first conductive film to form a first conductive layer and to expose a top surface of the semiconductor film that is not covered with the first conductive layer, and a fourth step of forming a second resist mask that covers a top surface and a side surface of the first conductive layer and part of the top surface of the semiconductor film and etching the semiconductor film to form a semiconductor layer and to expose a top surface of the insulating layer that is not covered with the semiconductor layer.

In the above, it is preferable that the second conductive film contain copper or aluminum, and the first conductive film and the third conductive film contain an element different from an element in the second conductive film. It is preferable that the first conductive film and the second conductive film each independently contain any of titanium, tungsten, molybdenum, chromium, tantalum, zinc, indium, platinum, and ruthenium.

In the above, the etching in the third step and the etching in the fourth step are preferably performed by a wet etching method.

In the above, it is preferable that the semiconductor film be formed in the first step in such a manner that a first metal oxide film and a second metal oxide film are sequentially formed. At this time, the second metal oxide film is preferably formed to have higher crystallinity than the first metal oxide film.

In the above, it is preferable to include a fifth step of forming a second conductive layer before the first step, and a sixth step of forming the insulating layer to cover the second conductive layer between the fifth step and the first step. At this time, a pair of first conductive layers is preferably formed to be apart from each other over the second conductive layer in the third step. In the fourth step, the second resist mask is preferably formed, in a position overlapping with the second conductive layer, to include a pair of regions overlapping with the pair of first conductive layers and a region connecting the regions to each other.

Another embodiment of the present invention is a semiconductor device including a first conductive layer, a first insulating layer, a semiconductor layer, and a pair of second conductive layers. The first insulating layer is provided to cover the first conductive layer, and the semiconductor layer is provided over the first insulating layer. The pair of second conductive layers is provided over the semiconductor layer and is provided to be apart from each other in a region overlapping with the first conductive layer. The second conductive layers are provided inward from an outline of the semiconductor layer in a plan view. A width in a channel width direction of a region of the semiconductor layer that overlaps with the first conductive layer and does not overlap with the pair of second conductive layers is smaller than a width in a channel width direction of a portion of one of the pair of second conductive layers that overlaps with the first conductive layer.

In the above, the semiconductor layer preferably has a stacked-layer structure in which a first metal oxide film and a second metal oxide film are stacked in this order from the first conductive layer side. At this time, the first metal oxide film preferably has lower crystallinity than the second metal oxide film.

In the above, the second conductive layer preferably includes a first conductive film, a second conductive film, and a third conductive film from the semiconductor layer side. At this time, the second conductive film preferably contains copper, silver, gold, or aluminum. It is preferable that the first conductive film and the third conductive film contain an element different from an element in the second conductive film, and each independently contain any of titanium, tungsten, molybdenum, chromium, tantalum, zinc, indium, platinum, and ruthenium.

Effect of the Invention

According to one embodiment of the present invention, a semiconductor device having good electrical characteristics and a fabrication method thereof can be provided. In addition, a semiconductor device having stable electrical characteristics and a fabrication method thereof can be provided. Another embodiment of the present invention can provide a highly reliable display device.

Note that the description of these effects does not preclude the existence of other effects. Note that one embodiment of the present invention does not necessarily have all of these effects. Note that effects other than them can be derived from the description of the specification, the drawings, the claims, and the like.

BRIEF DESCRIPTION OF THE DRAWINGS

FIG. 3 (A1), (A2), (B1), (B2), (C1), (C2) Diagrams illustrating a method for fabricating a transistor.
FIG. 4 (A1), (A2), (B1), (B2), (C1), (C2) Diagrams illustrating a method for fabricating a transistor.
FIG. 5 (A1), (A2), (B1), (B2), (C1), (C2) Diagrams illustrating a method for fabricating a transistor.

MODE FOR CARRYING OUT THE INVENTION

Figure 1A:
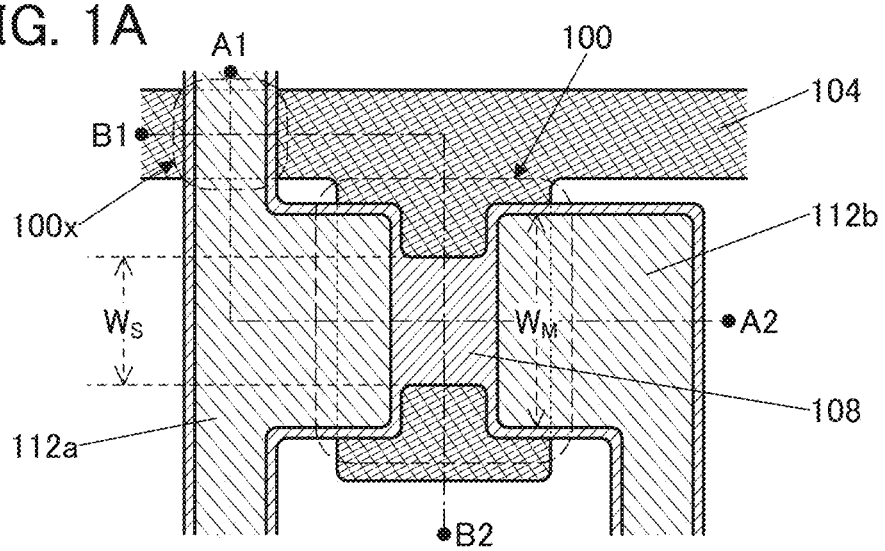
FIG. 1 (A), (B), (C) A structure example of a transistor.

Hereinafter, embodiments will be described with reference to the drawings. Note that the embodiments can be implemented in many different modes, and it will be readily appreciated by those skilled in the art that modes and details of the embodiments can be changed in various ways without departing from the spirit and scope thereof. Thus, the present invention should not be interpreted as being limited to the following description of the embodiments.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description are not limited to those used in this specification, and the description can be changed appropriately depending on the situation.

In this specification and the like, functions of a source and a drain of a transistor are sometimes switched from each other depending on the polarity of the transistor, the case where the direction of current flow is changed in circuit operation, or the like. Thus, the terms "source" and "drain" can be used interchangeably.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, an off-state current in this specification and the like refers to a drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a semiconductor device of one embodiment of the present invention and a fabrication method thereof will be described.

One embodiment of the present invention is a transistor including, over a formation surface, a gate electrode, a gate insulating layer over the gate electrode, a semiconductor layer over the gate insulating layer, and a pair of source and drain electrodes that is in contact with a top surface of the semiconductor layer. The semiconductor layer preferably contains a metal oxide exhibiting semiconductor characteristics (hereinafter, also referred to as an oxide semiconductor).

Another embodiment of the present invention relates to a method for fabricating the transistor. The semiconductor layer, the source electrode, and the drain electrode can be formed by the following method.

First, a semiconductor film to be the semiconductor layer is formed over the gate insulating layer, and a conductive film to be the source electrode and the drain electrode is successively formed over the semiconductor film. Next, a first resist mask corresponding to the patterns of the source electrode and the drain electrode is formed over the conductive film, and then, the conductive film is etched to form the source electrode and the drain electrode. At this time, the semiconductor film is not etched and part of its top surface (a portion overlapping with neither the source electrode nor the drain electrode) is exposed. In addition, the gate insulating layer is covered with the semiconductor film so as not to be exposed.

After that, a second resist mask is formed over a region to be the semiconductor layer. At this time, the second resist mask is formed not only over the region to be the semiconductor layer but also to cover the top surfaces and the side surfaces of the source electrode and the drain electrode. This allows the semiconductor film to be etched while the surfaces (the top surfaces and the side surfaces) of the source electrode and the drain electrode are not exposed and are protected by the second resist mask. With such a method, the surfaces of the source electrode and the drain electrode are not exposed to an etching atmosphere at the time of etching the semiconductor film; thus, the degree of freedom in selecting an etching method and a gas, a chemical solution, or the like used for the etching can be increased.

Another method for forming the semiconductor layer, the source electrode, and the drain electrode may be employed in which the semiconductor film is processed into an island shape to form the semiconductor layer and then the conductive film to be the source electrode and the drain electrode is formed. However, this method has a problem in that, because the conductive film is formed in contact with an end portion of the island-shaped semiconductor layer, the end portion tends to have a low resistance (become n-type). As a result, the low-resistance end portion of the semiconductor layer serves as a parasitic channel, which might adversely affect the electrical characteristics of the transistor, and for example, might cause an increase in leakage current or a shift in threshold voltage.

One method for forming the semiconductor layer, the source electrode, and the drain electrode is a method using a gray-tone mask or a half-tone mask. In this method, a resist mask including the patterns of the semiconductor layer, the source electrode, and the drain electrode is formed first, and the semiconductor film and the conductive film are etched together. After that, part of the resist mask is thinned by ashing or the like such that the resist pattern remains only over the regions to be the source electrode and the drain electrode, and then the conductive film is etched. However, in this method, the conductive film is etched with part of the gate insulating layer exposed; thus, the exposed part of the gate insulating layer might be thinned by the etching, thereby decreasing the insulating property of the gate insulating layer. Furthermore, the thinned gate insulating layer makes a large step in an outer edge of the semiconductor layer or in an outer edge of a portion where the semiconductor layer and the source electrode or the drain electrode are stacked. Accordingly, a protective insulating layer formed in a later step cannot sufficiently cover the step portion and thus a low-density region (also referred to as a void) is sometimes formed in the protective insulating layer, which might decrease the reliability of the transistor.

Patent Document 3 discloses a method for forming an island-shaped semiconductor layer (referred to as oxide semiconductor layer in the patent document) in which a source electrode and a drain electrode are formed over a semiconductor film (referred to as oxide semiconductor layer in the patent document) and then an island-shaped resist mask is formed. However, in this method, the top surfaces and the side surfaces of the source electrode and the drain electrode are partly exposed to an etching atmosphere at the time of etching the semiconductor film. This results in the reduced thicknesses, shape defects, and the like of the source electrode and the drain electrode, which might cause defects such as wiring resistance and a variation in the electrical characteristics of the transistor. In addition, some components of the source electrode and the drain electrode might be eluted or scattered at the time of etching the semiconductor film and attached to the surface of the semiconductor layer, thereby deteriorating the transistor characteristics.

By contrast, according to one embodiment of the present invention, the conductive film to be the source electrode and the drain electrode is formed before the semiconductor film is formed into an island shape; thus, a decrease in resistance of the end portion of the island-shaped semiconductor layer can be prevented. Furthermore, since the gate insulating layer is covered with the semiconductor film at the time of etching the conductive film, the gate insulating layer is not exposed to the etching atmosphere and its thickness is not reduced. Moreover, since the top surfaces and the side surfaces of the source electrode and the drain electrode are covered with the resist mask at the time of etching the semiconductor film, the top surfaces and the side surfaces of the source electrode and the drain electrode are not exposed to the etching atmosphere, which can prevent contamination or the like of the surface of the semiconductor layer in addition to shape defects and a reduction in the thicknesses of the source electrode and the drain electrode. Accordingly, a transistor that has favorable electrical characteristics and high reliability can be obtained.

According to one embodiment of the present invention, the source electrode and the drain electrode are not exposed to the etching atmosphere at the time of etching the semiconductor film; thus, the material of the conductive film used for the source electrode and the drain electrode is not limited, and a material with a lower resistance can be suitably used. A conductive material with an extremely low resistance that contains copper, silver, gold, aluminum, or the like can be suitably used for the source electrode and the drain electrode, for example.

Since the source electrode and the drain electrode are not exposed at the time of etching the semiconductor film, a wet etching method can be suitably used for the etching of the semiconductor film. The use of a wet etching method for the etching of the conductive film to be the source electrode and the drain electrode can reduce damage to the semiconductor film, in particular, a portion to be a channel formation region at the time of etching. When both of the conductive film and the semiconductor film are etched by a wet etching method, a highly reliable transistor can be fabricated with high productivity.

The semiconductor film preferably has a stacked-layer structure in which semiconductor films with different crystallinity are stacked. In particular, when a semiconductor film with high crystallinity is used as the upper semiconductor film in contact with the source electrode and the drain electrode, a reduction in thickness at the time of etching the conductive film to be the source electrode and the drain electrode can be inhibited. Furthermore, when a film with lower crystallinity than the upper semiconductor film is used as the lower semiconductor film, a transistor having high field-effect mobility can be obtained. At this time, the thickness of the lower semiconductor film is preferably larger than that of the upper semiconductor film because the lower semiconductor film serves as a portion through which current mainly flows.

More specific examples will be described below with reference to drawings.

Structure Example

A structure example of a transistor that can be fabricated with use of the fabrication method of a semiconductor device of one embodiment of the present invention will be described below.

Figure 1B:
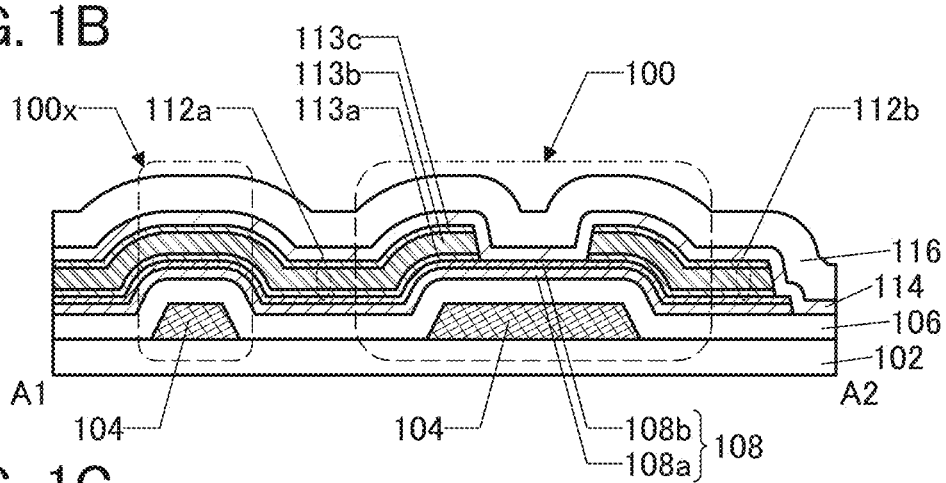
Figure 1C:
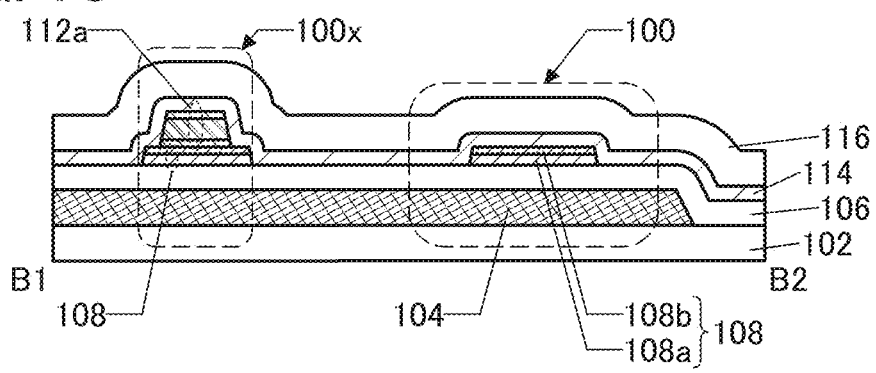

FIG. 1(A) is a top view of a structure including a transistor 100, FIG. 1(B) corresponds to a cross-sectional view of a cut plane along the dashed-dotted line A1-A2 in FIG. 1(A), and FIG. 1(C) corresponds to a cross-sectional view of a cut plane along the dashed-dotted line B1-B2 in FIG. 1(A). In the transistor 100, the direction of the dashed-dotted line A1-A2 corresponds to a channel length direction, and the direction of the dashed-dotted line B1-B2 corresponds to a channel width direction. Note that in FIG. 1(A), some components (e.g., a gate insulating layer) of the transistor 100 are not illustrated. Some components are not illustrated in top views of transistors in the following drawings, as in FIG. 1(A).

The transistor 100 is provided over a substrate 102 and includes a conductive layer 104, an insulating layer 106, a semiconductor layer 108, a conductive layer 112a, a conductive layer 112b, and the like. The insulating layer 106 is provided to cover the conductive layer 104. The semiconductor layer 108 is provided over the insulating layer 106. The conductive layer 112a and the conductive layer 112b are each in contact with a top surface of the semiconductor layer 108 and are apart from each other over the semiconductor layer 108 overlapping with the conductive layer 104. In addition, an insulating layer 114 is provided to cover the insulating layer 106, the conductive layer 112a, the conductive layer 112b, and the semiconductor layer 108, and an insulating layer 116 is provided over the insulating layer 114.

The conductive layer 104 functions as a gate electrode. Part of the insulating layer 106 functions as a gate insulating layer. The conductive layer 112a functions as one of a source electrode and a drain electrode, and the conductive layer 112b functions as the other. A region of the semiconductor layer 108 that overlaps with the conductive layer 104 and is sandwiched between the conductive layer 112a and the conductive layer 112b functions as a channel formation region. The transistor 100 is what is called a bottom-gate transistor, in which the gate electrode is provided more on the formation surface side than the semiconductor layer 108. Here, a side of the semiconductor layer 108 opposite to the conductive layer 104 side is sometimes referred to as a back channel side. The transistor 100 has what is called a channel-etched structure in which no protective layer is provided between the back channel side of the semiconductor layer 108 and the source and drain electrodes.

The semiconductor layer 108 is provided between the insulating layer 106 and the conductive layer 112a and the conductive layer 112b. Thus, the conductive layer 112a and the conductive layer 112b are not in contact with the insulating layer 106. As illustrated in FIG. 1(A), the semiconductor layer 108 preferably has a portion extending beyond the outlines of the conductive layer 112a and the conductive layer 112b in a plan view.

FIGS. 1(A), 1(B), and 1(C) illustrate an intersection portion 100x where the conductive layer 104 intersects with the conductive layer 112a. The insulating layer 106 and the semiconductor layer 108 are provided between the conductive layer 104 and the conductive layer 112a. With such a structure, parasitic capacitance between the conductive layer 104 and the conductive layer 112a can be reduced as compared with the case where the semiconductor layer 108 is not provided.

The semiconductor layer 108 has a stacked-layer structure in which a semiconductor layer 108a and a semiconductor layer 108b are stacked in this order from the formation surface side (substrate 102 side). Each of the semiconductor layer 108a and the semiconductor layer 108b preferably contains a metal oxide. The semiconductor layer 108b, which is positioned on the back channel side, preferably has higher crystallinity than the semiconductor layer 108a, which is positioned on the conductive layer 104 side. With this structure, the semiconductor layer 108 can be prevented from being partly etched and lost at the time of processing of the conductive layer 112a and the conductive layer 112b.

For example, a metal oxide film having a CAAC (c-axis aligned crystal) structure described later, a metal oxide film having an nc (nano crystal) structure, or a metal oxide film in which a CAAC structure and an nc structure are mixed is preferably used as the semiconductor layer 108b positioned on the back channel side. In addition, a metal oxide film having a CAAC structure, a metal oxide film having an nc structure, or a metal oxide film in which a CAAC structure and an nc structure are mixed is preferably used as the semiconductor layer 108a positioned on the conductive layer 104 side. The semiconductor layer 108 can suitably have a stacked-layer structure of the semiconductor layer 108a having an nc structure and the semiconductor device 108b having a CAAC structure. Alternatively, a stacked-layer structure of the semiconductor layer 108a having an nc structure and the semiconductor layer 108b having an nc structure may be employed. At this time, a metal oxide film having higher crystallinity than the semiconductor layer 108a is preferably used as the semiconductor layer 108b. Note that for a function or a material composition of a metal oxide that can be suitably used for the semiconductor layer 108a and the semiconductor layer 108b, refer to a CAC (Cloud-Aligned Composite) described later.

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably aluminum, gallium, yttrium, or tin.

It is particularly preferable to use an oxide containing indium, gallium, and zinc for the semiconductor layer 108.

As the semiconductor layer 108a and the semiconductor layer 108b, layers with different compositions, layers with different crystallinity, or layers with different impurity concentrations may be used. The semiconductor layer 108 has a stacked-layer structure of the semiconductor layer 108a and the semiconductor layer 108b here, but may have a single-layer structure or a stacked-layer structure of three or more layers.

The conductive layer 112a and the conductive layer 112b each have a stacked-layer structure in which a conductive layer 113a, a conductive layer 113b, and a conductive layer 113c are stacked in this order from the formation surface side.

For the conductive layer 113b, a material having resistance lower than those of the conductive layer 113a and the conductive layer 113c is preferably used. For example, the conductive layer 113b is preferably formed using a low-resistance conductive material containing copper, silver, gold, aluminum, or the like. It is particularly preferable that the conductive layer 113b contain copper or aluminum. In that case, the conductive layer 112a and the conductive layer 112b can have extremely low resistance.

The conductive layer 113a and the conductive layer 113c can be each independently formed using a conductive material different from that of the conductive layer 113b. For example, the conductive layer 113a and the conductive layer 113c can be each independently formed using a conductive material containing titanium, tungsten, molybdenum, chromium, tantalum, zinc, indium, platinum, ruthenium, or the like.

In particular, a material that is less likely to be oxidized than the conductive layer 113b is preferably used for the conductive layer 113a and the conductive layer 113c. When the conductive layer 113b containing copper, aluminum, or the like is sandwiched between the conductive layer 113a and the conductive layer 113c as described above, oxidation of the surface of the conductive layer 113b can be inhibited. In addition, diffusion of an element contained in the conductive layer 113b into neighboring layers can be inhibited. Specifically, provision of the conductive layer 113a between the semiconductor layer 108 and the conductive layer 113b can prevent diffusion of a metal element contained in the conductive layer 113a into the semiconductor layer 108, thereby enabling the transistor 100 to have high reliability.

Note that the structure of the conductive layer 112a and the conductive layer 112b is not limited to a three-layer structure and may be a two-layer structure or a four-layer structure including a conductive layer containing copper, silver, gold, or aluminum. For example, a two-layer structure in which the conductive layer 113a and the conductive layer 113b are stacked or a two-layer structure in which the conductive layer 113b and the conductive layer 113c are stacked may be employed.

For the conductive layer 104, any of the above conductive materials that can be used for the conductive layer 113a and the conductive layer 113b can be used as appropriate. The use of a conductive material containing copper is particularly preferable. In the case where the conductive layer 104 has a stacked-layer structure, a conductive film that is less likely to be oxidized than a low-resistance conductive layer is preferably used over and/or under the conductive layer, as in the conductive layer 112a and the conductive layer 112b.

For the insulating layer 106 and the insulating layer 114 that are in contact with the semiconductor layer 108, an insulating material containing an oxide is preferably used. In the case where the insulating layer 106 or the insulating layer 114 has a stacked-layer structure, an insulating material containing an oxide is used for a layer in contact with the semiconductor layer 108.

For the insulating layer 106, a nitride insulating film of silicon nitride, aluminum nitride, or the like may be used. In the case where an insulating material containing no oxide is used, treatment for adding oxygen to an upper portion of the insulating layer 106 is preferably performed to form an oxygen-containing region. Examples of the treatment for adding oxygen include heat treatment or plasma treatment in an oxygen-containing atmosphere, and an ion doping treatment.

The insulating layer 116 functions as a protective layer protecting the transistor 100. For the insulating layer 116, an inorganic insulating material such as silicon nitride, silicon nitride oxide, silicon oxide, silicon oxynitride, aluminum oxide, or aluminum nitride can be used. It is particularly preferable that a material less likely to diffuse oxygen, such as silicon nitride or aluminum oxide, be used for the insulating layer 116, in which case diffusion of oxygen released from the semiconductor layer 108 or the insulating layer 114 to the outside through the insulating layer 116 due to heat applied during the fabrication process or the like can be prevented.

For the insulating layer 116, an organic insulating material functioning as a planarization film may be used. Alternatively, a stacked-layer film that includes a film containing an inorganic insulating material and a film containing an organic insulating material may be used as the insulating layer 116.

In the semiconductor layer 108, a pair of low-resistance regions, which are positioned in portions in contact with the conductive layer 112a and the conductive layer 112b and in the vicinity thereof and function as a source region and a drain region, may be formed. The regions are part of the semiconductor layer 108 and have lower resistance than the channel formation region. The low-resistance regions can also be referred to as regions with high carrier density, n-type regions, or the like. In the semiconductor layer 108, a region that is sandwiched between the pair of low-resistance regions and overlaps with the conductive layer 104 functions as a channel formation region.

Here, FIG. 1(A) shows an example in which the width $W_S$ in the channel width direction of the semiconductor layer 108 is smaller than the width $W_M$ in the channel length direction of the conductive layer 112a and the conductive layer 112b in a region overlapping with the conductive layer 104. In other words, in a plan view, the width $W_S$ in the channel width direction of a region of the semiconductor layer 108 that overlaps with the conductive layer 104 and overlaps with neither the conductive layer 112a nor the conductive layer 112b (i.e., a channel formation region) is smaller than the width $W_M$ in the channel width direction of a portion of the conductive layer 112a or the conductive layer 112b that overlaps with the conductive layer 104. This structure can reduce the area occupied by the transistor 100.

Figure 2A:
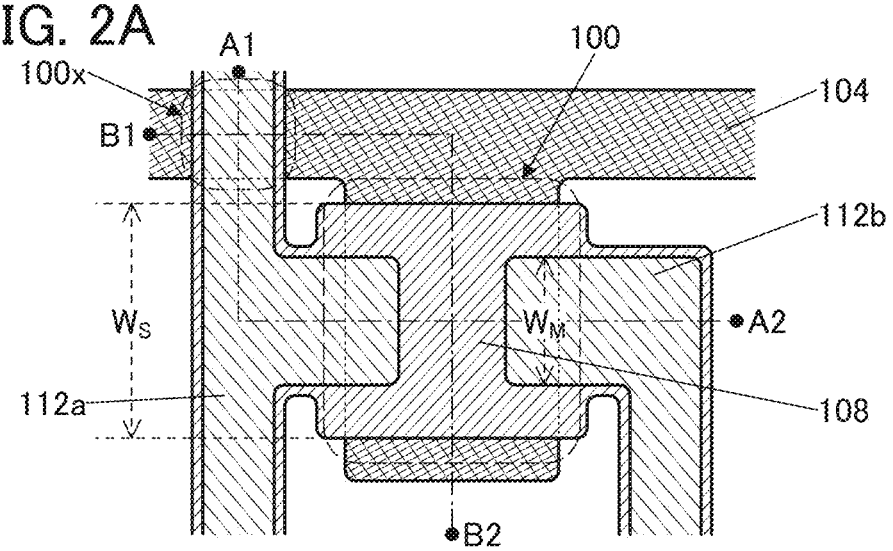
FIG. 2 (A), (B), (C) A structure example of a transistor.
Figure 2B:
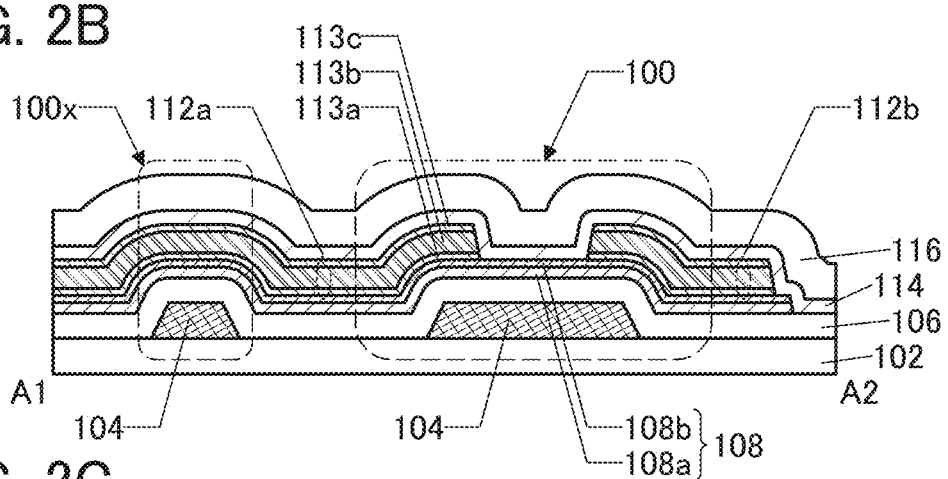
Figure 2C:
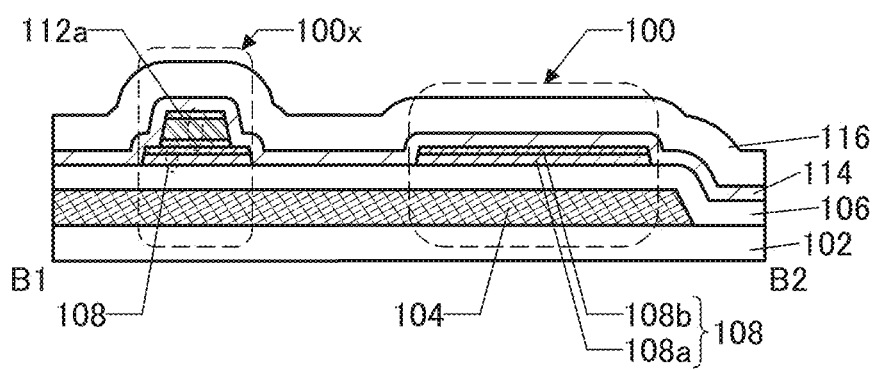

Note that the shapes of the layers included in the transistor 100 in a plan view (layout patterns) are not limited to the above, and a layout pattern in which the width $W_S$ is larger than the width $W_M$ as illustrated in FIG. 2(A), FIG. 2(B), and FIG. 2(C) may be employed.

The above is the description of Structure example 1.

Fabrication Method Example

A method for fabricating the semiconductor device of one embodiment of the present invention will be described below with reference to drawings. Here, description will be made giving, as an example, the transistor 100 described in Embodiment 1.

Note that thin films that constitute the semiconductor device (insulating films, semiconductor films, conductive films, and the like) can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that constitute the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, and the thin film is processed into a desired shape.

For light for exposure in a photolithography method, an i-line (with a wavelength of 365 nm), a g-line (with a wavelength of 436 nm), an h-line (with a wavelength of 405 nm), or combined light of any of them can be used, for example. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case where exposure is performed by scanning of a beam such as an electron beam, a photomask is not needed.

For etching of the thin film, a dry etching method, a wet etching method, a sandblasting method, or the like can be used.

FIG. 3(A1), FIG. 3(A2), FIG. 3(B1), FIG. 3(B2), FIG. 3(C1), FIG. 3(C2), FIG. 4(A1), FIG. 4(A2), FIG. 4(B1), FIG. 4(B2), FIG. 4(C1), FIG. 4(C2), FIG. 5(A1), FIG. 5(A2), FIG. 5(B1), FIG. 5(B2), FIG. 5(C1), and FIG. 5(C2) are diagrams illustrating a method for fabricating the transistor 100. In each of the diagrams, (A1), (B1), and (C1) on the left side show schematic top views, and (A2), (B2), and (C2) on the right side show cross-sectional views. In the cross-sectional views, cross sections in the channel length direction are shown on the left side of the dashed-dotted lines, and cross sections in the channel width direction are shown on the right side.

[Formation of Conductive Layer 104]

A conductive film is formed over the substrate 102, a resist mask is formed by a lithography process over the conductive film, and then the conductive film is etched, whereby the conductive layer 104 functioning as a gate electrode is formed (FIGS. 3(A1) and 3(A2)).

[Formation of Insulating Layer 106]

Next, the insulating layer 106 covering the conductive layer 104 and the substrate 102 is formed (FIGS. 3(B1) and 3(B2)). The insulating layer 106 can be formed by a PECVD method or the like, for example.

After the formation of the insulating layer 106, treatment for supplying oxygen to the insulating layer 106 may be performed. As a method for supplying oxygen, an oxygen radical, an oxygen atom, an oxygen atomic ion, an oxygen molecular ion, or the like is supplied to the insulating layer 106 by an ion doping method, an ion implantation method, plasma treatment, or the like.

Alternatively, a film that suppresses oxygen release may be formed over the insulating layer 106, and then oxygen may be added to the insulating layer 106 through the film. It is preferable to remove the film after addition of oxygen. As the above film that suppresses oxygen release, a conductive film or a semiconductor film containing one or more of indium, zinc, gallium, tin, aluminum, chromium, tantalum, titanium, molybdenum, nickel, iron, cobalt, and tungsten can be used.

A metal oxide film may be formed over the insulating layer 106 by a sputtering method or the like in an oxygen-containing atmosphere to supply oxygen to the insulating layer 106. For example, the metal oxide film is preferably formed by a sputtering method using a sputtering target containing a metal element such as indium, zinc, tin, gallium, or aluminum or a sputtering target containing an oxide of any of these elements. After that, the metal oxide film is preferably removed.

Furthermore, before the treatment for supplying oxygen, heat treatment for releasing water or hydrogen from the surface and inside of the insulating layer 106 may be performed. For example, the heat treatment can be performed in a nitrogen atmosphere at a temperature higher than or equal to 300° C. and lower than the heat resistant temperature of the conductive layer 104, preferably at 300° C. to 450° C. inclusive.

[Formation of Metal Oxide Film]

Next, a metal oxide film 108$af$ and a metal oxide film 108$bf$ are formed to be stacked over the insulating layer 106 (FIGS. 3(C1) and 3(C2)).

The metal oxide film 108$af$ and the metal oxide film 108$bf$ are each preferably formed by a sputtering method using a metal oxide target.

In forming the metal oxide film 108$af$ and the metal oxide film 108$bf$, an inert gas (e.g., a helium gas, an argon gas, or a xenon gas) may be mixed in addition to an oxygen gas. Note that the proportion of the oxygen gas in the whole film formation gas (hereinafter, also referred to as an oxygen flow rate ratio) in forming the metal oxide film can be in the range of 0% to 100% inclusive.

When a metal oxide film with relatively low crystallinity is formed with a low oxygen flow rate ratio, a metal oxide film having high conductivity can be obtained. By contrast, when a metal oxide film with relatively high crystallinity is formed with a high oxygen flow rate ratio, a metal oxide film having high etching resistance and electrical stability can be obtained.

Here, the metal oxide film 108$af$ positioned on the conductive layer 104 (functioning as a gate electrode) side is a film with low crystallinity whereas the metal oxide film 108$bf$ positioned on the back channel side is a film with high crystallinity, which enables a transistor to have high reliability and high field-effect mobility.

The metal oxide film 108$af$ and the metal oxide film 108$bf$ are formed under the film formation conditions where a substrate temperature is higher than or equal to room temperature and lower than or equal to 350° C., preferably higher than or equal to room temperature and lower than or equal to 200° C., further preferably higher than or equal to room temperature and lower than or equal to 140° C., for example. The substrate temperature during formation of the metal oxide film is preferably, for example, higher than or equal to room temperature and lower than 140° C. because the productivity is increased.

More specifically, the oxygen flow rate ratio during formation of the metal oxide film 108$af$ is higher than or equal to 0% and lower than 50%, preferably 0% to 30% inclusive, further preferably 0% to 20% inclusive, typically 10%. The oxygen flow rate ratio during formation of the metal oxide film 108$bf$ is 50% to 100% inclusive, preferably 60% to 100% inclusive, further preferably 80% to 100% inclusive, still further preferably 90% to 100% inclusive, typically 100%. Furthermore, although conditions during the film formation, such as pressure, temperature, and power, may vary between the metal oxide film 108$af$ and the metal oxide film 108$bf$, it is preferable to employ the same conditions except for the oxygen flow rate ratio because the time required for the film formation step can be shortened.

Here, the deposition conditions of the metal oxide film 108$af$ are preferably set such that the metal oxide film 108$af$ becomes a metal oxide film having a CAAC structure, a metal oxide film having an nc structure, or a metal oxide film in which a CAAC structure and an nc structure are mixed. Meanwhile, the deposition conditions of the metal oxide film 108$bf$ are preferably set such that the metal oxide film 108$bf$ becomes a metal oxide film having higher crystallinity than the metal oxide film 108$af$ and having a CAAC structure or a structure in which a CAAC structure and an nc structure are mixed. Note that the composition of a sputtering target to be used differs between the deposition conditions for the metal oxide film formed to have a CAAC structure and the deposition conditions for the metal oxide film formed to have an nc structure; thus, a substrate temperature, an oxygen flow rate ratio, pressure, power, and the like are set as appropriate depending on the composition. At this time, the metal oxide film 108$af$ and the metal oxide film 108$bf$ are preferably formed under the same conditions except for an oxygen flow rate ratio as described above.

Note that the metal oxide film 108$af$ and the metal oxide film 108$bf$ may be films with different compositions from each other. In that case, when an In—Ga—Zn oxide is used for both the metal oxide film 108$af$ and the metal oxide film 108$bf$, an oxide target in which the proportion of the contained In is higher than that in the metal oxide film 108$bf$ is preferably used for the metal oxide film 108$af$.

Note that in the case where the semiconductor layer 108 has a single-layer structure, one of the methods for forming the metal oxide film 108$af$ and the metal oxide film 108$bf$ can be referred to. In particular, the method for forming the metal oxide film 108$af$ is preferably used.

[Formation of Conductive Film]

Next, a conductive film 113$af$, a conductive film 113$bf$, and a conductive film 113$cf$ are formed to be stacked in this order to cover the top surface of the metal oxide film 108$bf$ (FIGS. 4(A1) and 4(A2)).

The conductive film 113$bf$ is a film to be the conductive layer 113$b$ later and preferably contains copper, silver, gold, or aluminum. The conductive film 113$af$ and the conductive film 113$cf$ are films to be the conductive layer 113$a$ and the conductive layer 113$c$ later, respectively, and each preferably independently contain titanium, tungsten, molybdenum, chromium, tantalum, zinc, indium, platinum, ruthenium, or the like.

The conductive film 113$af$, the conductive film 113$bf$, and the conductive film 113$cf$ are preferably formed by a film formation method such as a sputtering method, an evaporation method, or a plating method.

[Formation of Conductive Layer 112$a$ and Conductive Layer 112$b$]

Then, resist masks 115 are formed over the conductive film 113$cf$ (FIGS. 4(B1) and 4(B2)).

As illustrated in FIGS. 4(B1) and 4(B2), the resist masks 115 are provided over regions to be the conductive layer 112$a$ and the conductive layer 112$b$. Specifically, a pair of resist masks 115 is formed to be apart from each other in a region overlapping with the conductive layer 104 and overlapping with a portion to be a channel formation region after the metal oxide film 108*af* and the metal oxide film 108*bf* are etched.

Next, a portion of the conductive film 113*cf*, the conductive film 113*bf*, and the conductive film 113*af* that is not covered with the resist masks 115 is removed by etching, whereby the conductive layer 112*a* and the conductive layer 112*b* are formed. After that, the resist masks 115 are removed (FIGS. 4(C1) and 4(C2)).

A dry etching method, a wet etching method, or the like can be used for the etching. In particular, a wet etching method is preferably used, in which case damage to the metal oxide film 108*bf* at the time of etching can be reduced.

At the time of etching the conductive film 113*af*, the insulating layer 106 is covered with the metal oxide film 108*af* and the metal oxide film 108*bf*. Thus, there is no risk of etching the insulating layer 106, which can prevent generation of a large step in the outer edge portions of the semiconductor layer 108, the conductive layer 112*a*, and the conductive layer 112*b* later due to a reduction in thickness of the insulating layer 106. Furthermore, the influence on the insulating layer 106 does not need to be considered in selecting an etching method of the conductive film 113*af* or the like; thus, the process flexibility can be increased.

[Formation of Semiconductor Layer 108]

Next, a resist mask 117 is formed over the metal oxide film 108*bf*, the conductive layer 112*a*, and the conductive layer 112*b* (FIGS. 5(A1) and 5(A2)).

Here, the resist mask 117 is provided over a portion that overlaps with the conductive layer 104 and connects regions between the conductive layer 112*a* and the conductive layer 112*b*, i.e., a portion of the semiconductor layer 108 to be a channel formation region later. Furthermore, as illustrated in FIGS. 5(A1) and 5(A2), the resist mask 117 is provided to cover the top surfaces and the side surfaces of the conductive layer 112*a* and the conductive layer 112*b*. That is, the resist mask 117 is formed such that, in the outer edge portions of the conductive layer 112*a* and the conductive layer 112*b*, the side surface of the resist mask 117 is positioned outward from the side surface of the conductive layer 112*a* or the conductive layer 112*b*. In other words, the resist mask 117 is formed to cover the conductive layer 112*a* and the conductive layer 112*b* in a plan view.

Next, regions of the metal oxide film 108*bf* and the metal oxide film 108*af* that are not covered with the resist mask 117 are removed by etching, whereby the semiconductor layer 108 (the semiconductor layer 108*a* and the semiconductor layer 108*b*) is formed. After that, the resist mask 117 is removed (FIGS. 5(B1) and 5(B2)).

A dry etching method, a wet etching method, or the like can be used for the etching of the metal oxide film 108*bf* and the metal oxide film 108*af*. In particular, a wet etching method is preferably used, in which case a reduction in thickness of an exposed portion of the insulating layer 106 can be inhibited.

At the time of etching the metal oxide film 108*bf* and the metal oxide film 108*af*, the top surfaces and the side surfaces of the conductive layer 112*a* and the conductive layer 112*b* are covered with the resist mask 117 and thus are not exposed to the etching atmosphere. This can prevent reductions in thicknesses and line widths of the conductive layer 112*a* and the conductive layer 112*b*, for example. In addition, contamination of the surface of the semiconductor layer 108 on the back channel side due to elution or scattering of part of the conductive layer 112*a* and the conductive layer 112*b* can be prevented, so that a highly reliable transistor can be obtained.

In the case where a wet etching method is used for the etching of the conductive film 113*af* or the like and the etching of the metal oxide film 108*bf* and the metal oxide film 108*af*, different etchants may be used or the same etchant may be used. In the case of using the same etchant, the etchant is selected such that the etching rate of the conductive film 113*af* is higher than those of the metal oxide film 108*bf* and the metal oxide film 108*af*, so that the metal oxide film 108*bf* can be prevented from being etched and lost at the time of etching the conductive film 113*af*. At this time, a film having higher crystallinity than the metal oxide film 108*af* is preferably used as the metal oxide film 108*bf*, in which case the etching resistance at the time of etching the conductive film 113*af* can be increased. With the use of such an etchant, the etching rates of the metal oxide film 108*bf* and the metal oxide film 108*af* can be relatively low, thereby preventing receding of the end portion of the semiconductor layer 108 inward from the end portion of the conductive layer 112*a* or the conductive layer 112*b* because of the etching of the side surface of the semiconductor layer 108. As a result, the step coverage with the insulating layer 114 and the insulating layer 116 formed later can be increased, and a highly reliable transistor can be obtained.

[Formation of Insulating Layer 114]

Next, the insulating layer 114 is formed to cover the conductive layer 112*a*, the conductive layer 112*b*, the semiconductor layer 108, and the insulating layer 106.

The insulating layer 114 is preferably formed in, for example, an oxygen-containing atmosphere. It is particularly preferable that the insulating layer 114 be formed by a plasma CVD method in an oxygen-containing atmosphere. Thus, the insulating layer 114 with few defects can be formed.

As the insulating layer 114, for example, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having a small amount of defects can be formed as the insulating layer 114 with the PECVD apparatus in which the flow rate of the oxidizing gas is more than 20 times and less than 100 times, or more than or equal to 40 times and less than or equal to 80 times the flow rate of the deposition gas and the pressure in a treatment chamber is lower than 100 Pa or lower than or equal to 50 Pa.

The insulating layer 114 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and power can be used for dissociation and ionization of more molecules; thus, plasma with a high density (high-density plasma) can be excited. Thus, little plasma damage to the deposition surface and a deposit is caused, so that the insulating layer 114 having few defects can be formed.

Here, plasma treatment may be performed in an oxygen-containing atmosphere to supply oxygen to the semiconductor layer 108 before the insulating layer 114 is formed. As a gas used for the plasma treatment, a gas containing nitrogen oxide such as $N_2O$ (nitrous oxide or dinitrogen monoxide), $NO_2$ (nitrogen dioxide), or NO (nitric oxide), $O_2$ (oxygen), O₃ (ozone), or the like is preferably used, for example. A mixed gas containing the above gas and a rare gas such as argon is preferably used.

It is preferable that the film formation be performed successively after the above plasma treatment without exposure of the substrate 102 to the air. The plasma treatment is preferably performed in the apparatus for forming the insulating layer 114, for example. In that case, the plasma treatment is preferably performed in the film formation chamber where the insulating layer 114 is formed. Alternatively, a structure may be employed in which the plasma treatment is performed in a treatment chamber connected to the film formation chamber via a gate valve or the like and then the substrate is transferred to the film formation chamber for the insulating layer 114 without exposure to the air and under a reduced pressure. In the case where the plasma treatment and the formation of the insulating layer 114 are successively performed in the same film formation chamber of the same apparatus, the plasma treatment and the formation of the insulating layer 114 are preferably performed at the same temperature.

After the formation of the insulating layer 114, treatment for supplying oxygen to the insulating layer 114 may be performed. As the treatment for supplying oxygen, a method similar to that for the insulating layer 106 can be used.

[Formation of Insulating Layer 116]

Next, the insulating layer 116 is formed to cover the insulating layer 114 (FIGS. 5(C1) and 5(C2)).

For the insulating layer 116, an insulating film that is less likely to diffuse oxygen, hydrogen, water, or the like than the insulating layer 114 is preferably used. With the insulating layer 116 that is less likely to diffuse oxygen, oxygen in the semiconductor layer 108 can be prevented from diffusing to the outside through the insulating layer 114. Furthermore, with the insulating layer 116 that is less likely to diffuse hydrogen, hydrogen, water, or the like can be prevented from diffusing to the semiconductor layer 108 or the like from the outside.

Through the above steps, the transistor 100 can be fabricated.

According to the method for fabricating a transistor described here, a reduction in thickness of an exposed portion of the gate insulating layer can be inhibited, the step coverage with the protective insulating layer is improved, and a highly reliable transistor can be obtained. Since the top surfaces and the side surfaces of the source electrode and the drain electrode are covered with the resist mask at the time of etching for forming the semiconductor layer, the top surfaces and the side surfaces are not exposed to the etching atmosphere, which can prevent contamination or the like of the surface of the semiconductor layer in addition to shape defects and a reduction in the thicknesses of the source electrode and the drain electrode. Accordingly, a transistor with extremely high reliability can be obtained.

The above is the description of the fabrication method example of the transistor.

Modification Example of Structure Example

Modification examples of the transistor described in the above structure example will be described below.

Modification Example 1

Figure 6A:
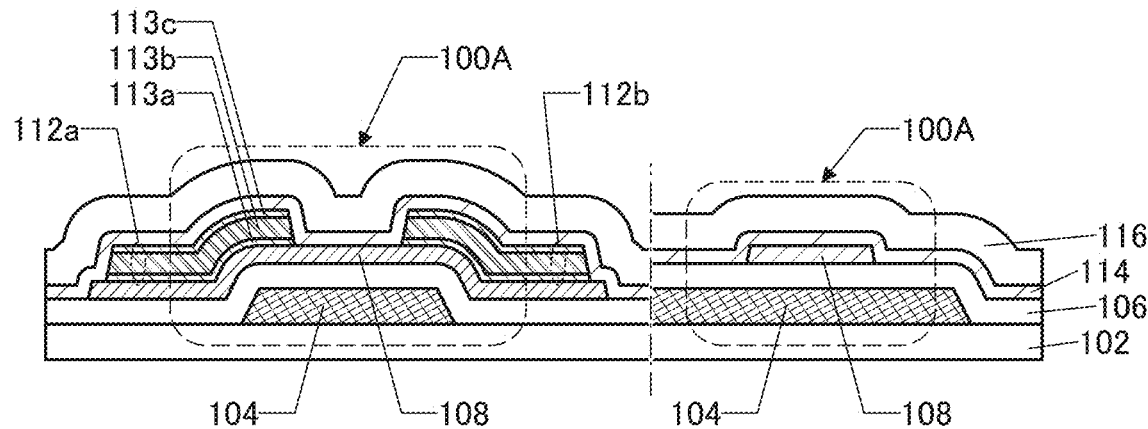
FIG. 6 (A), (B), (C) Structure examples of transistors.

A transistor 100A illustrated in FIG. 6(A) is different from the transistor 100 described in Structure example 1 shown above in that the semiconductor layer 108 does not have a stacked-layer structure.

When the semiconductor layer 108 has a single-layer structure, the fabrication process can be simplified and the productivity can be improved. In this case, it is preferable to use a metal oxide film having crystallinity as the semiconductor layer 108.

Modification Example 2

Figure 6B:
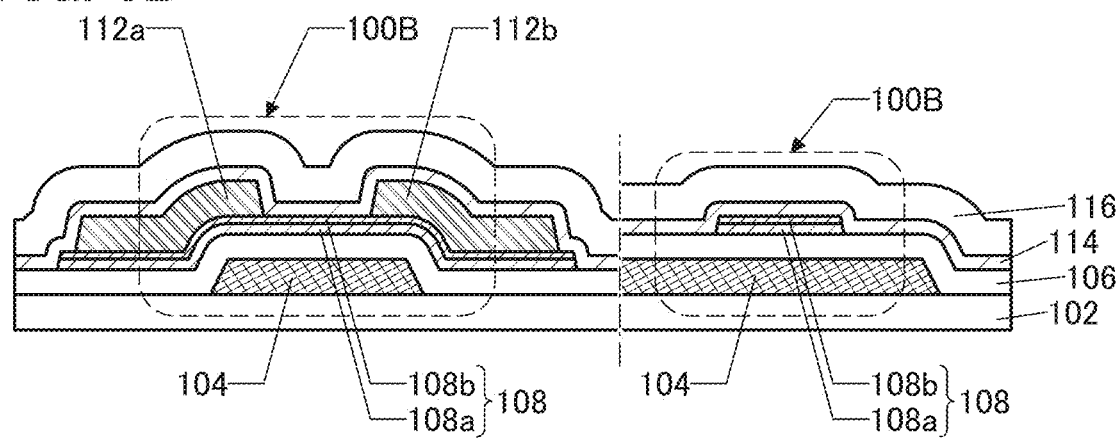

A transistor 100B illustrated in FIG. 6(B) is different from the transistor 100 described in Structure example 1 shown above in that the conductive layer 112a and the conductive layer 112b do not have a stacked-layer structure.

When the conductive layer 112a and the conductive layer 112b each have a single-layer structure, the productivity can be improved. A material that can be used for the conductive layer 113a or the conductive layer 113b can be selected as appropriate for the conductive layer 112a and the conductive layer 112b. In particular, a conductive material with an extremely low resistance that contains copper, silver, gold, aluminum, or the like can be suitably used.

Modification Example 3

Figure 6C:
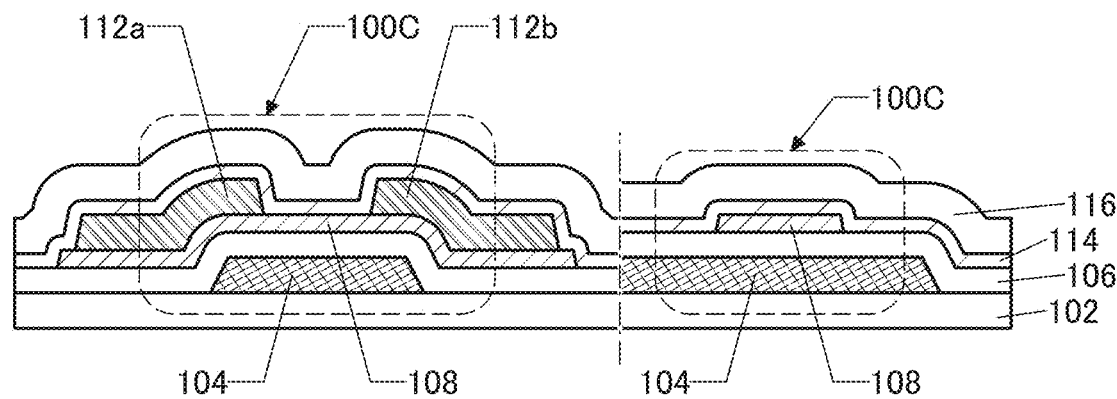

A transistor 100C illustrated in FIG. 6(C) is different from the transistor 100 described in the above structure example in that the semiconductor layer 108, the conductive layer 112a, and the conductive layer 112b do not have a stacked-layer structure. With such a structure, the productivity can be further increased.

Modification Example 4

Figure 7A:
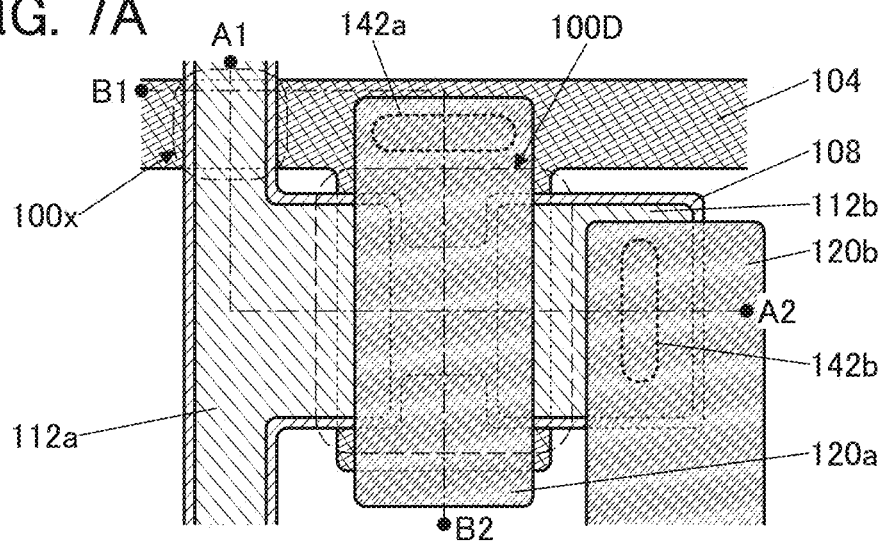
FIG. 7 (A), (B), (C) A structure example of a transistor.
Figure 7B:
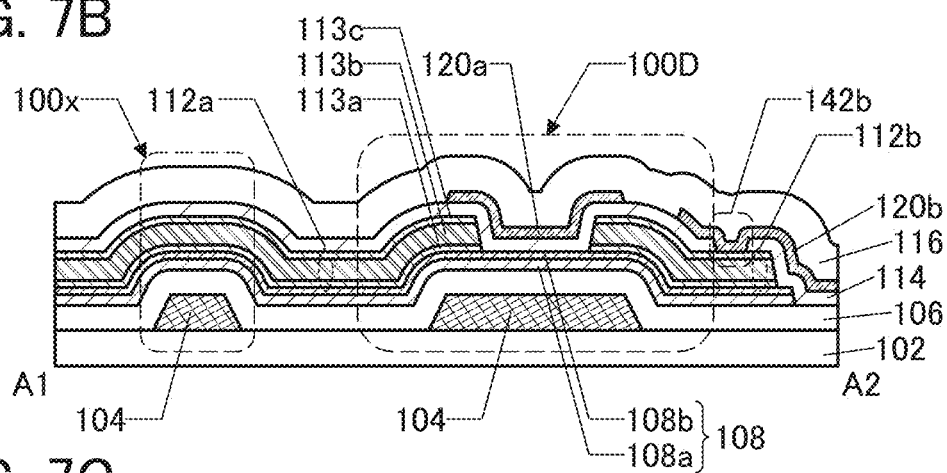
Figure 7C:
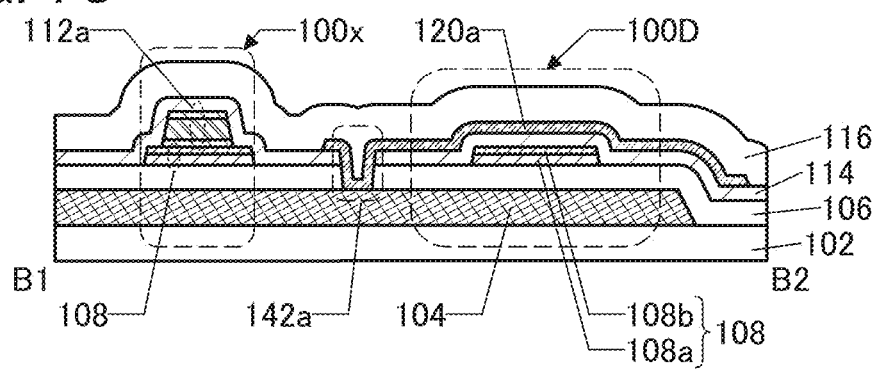

A transistor 100D illustrated in FIGS. 7(A), 7(B), and 7(C) is different from the transistor 100 described in the above structure example mainly in that a conductive layer 120a and a conductive layer 120b are included.

The conductive layer 120a and the conductive layer 120b are provided over the insulating layer 114.

The conductive layer 120a includes a region overlapping with the semiconductor layer 108 and the conductive layer 104.

In the transistor 100D, the conductive layer 104 has a function of a first gate electrode (also referred to as a bottom gate electrode), and the conductive layer 120a has a function of a second gate electrode (also referred to as a top gate electrode). Part of the insulating layer 114 functions as a second gate insulating layer.

As illustrated in FIG. 7(C), the conductive layer 120a may be electrically connected to the conductive layer 104 through an opening portion 142a provided in the insulating layer 114 and the insulating layer 106. Accordingly, the same potential can be supplied to the conductive layer 120a and the conductive layer 104, which enables the transistor 100D to have high on-state current.

As illustrated in FIGS. 7(A) and 7(C), the conductive layer 104 and the conductive layer 120a preferably extend beyond the end portion of the semiconductor layer 108 in the channel width direction. In that case, as illustrated in FIG. 7(C), the semiconductor layer 108 in the channel width direction is entirely surrounded by the conductive layer 104 and the conductive layer 120a.

With such a structure, the semiconductor layer 108 can be electrically surrounded by electric fields generated by a pair of gate electrodes. In that case, it is particularly preferable that the same potential be supplied to the conductive layer 104 and the conductive layer 120a. Accordingly, electric fields for inducing a channel can be effectively applied to the semiconductor layer 108, whereby the on-state current of the transistor 100D can be increased. Moreover, the transistor 100D can be miniaturized.

Note that a structure in which the conductive layer 104 and the conductive layer 120a are not connected to each other may be employed. In that case, a constant potential may be supplied to one of the pair of gate electrodes, and a signal for driving the transistor 100D may be supplied to the other. In this case, the potential supplied to one of the electrodes can control the threshold voltage at the time of driving the transistor 100D with the other electrode.

The conductive layer 120b is electrically connected to the conductive layer 112b through an opening portion 142b provided in the insulating layer 114. The conductive layer 120b can be used as a wiring or an electrode. When used in a display device, for example, the conductive layer 120b can function as a pixel electrode or a wiring for connecting the transistor 100D to a pixel electrode.

Note that the conductive layer 120a and the conductive layer 120b are provided between the insulating layer 114 and the insulating layer 116 in FIG. 7(A), FIG. 7(B), and FIG. 7(C) but may be provided over the insulating layer 116.

The above is the description of the modification examples.

Application Example

An example of the case where the above-described transistor is used for pixels of a display device will be described below.

FIG. 8(A), FIG. 8(B), FIG. 8(C), FIG. 8(D), and FIG. 8(E) are each a schematic top view illustrating a portion of subpixels of the display device. One subpixel includes at least one transistor and a conductive layer (here, the conductive layer 120b) functioning as a pixel electrode. Note that a structure example of a portion of subpixels is shown here in order to simplify the description; however, another transistor, a capacitor, or the like can be provided as appropriate depending on the kind of display elements used in the subpixels, the function to be added to the pixels, and the like.

Figure 8A:
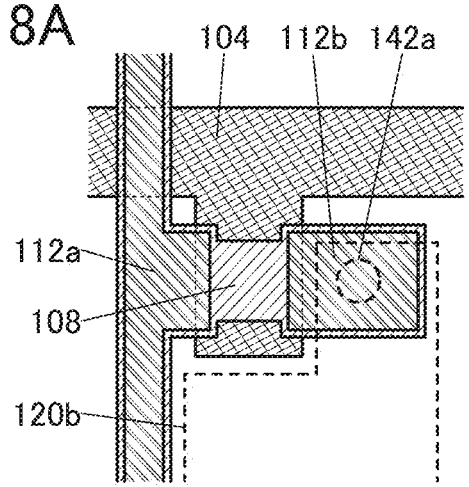
FIG. 8 (A), (B), (C), (D), (E) Structure examples of a transistor.

In FIG. 8(A), a portion of the conductive layer 104 functions as a gate line (also referred to as a scan line), a portion of the conductive layer 112a functions as a source line (also referred to as a video signal line), and a portion of the conductive layer 112b functions as a wiring that electrically connects the transistor and the conductive layer 120b.

In FIG. 8(A), the conductive layer 104 has a top-view shape with a sticking-out portion, and the semiconductor layer 108 is provided over this sticking-out portion to constitute a transistor.

Figure 8B:
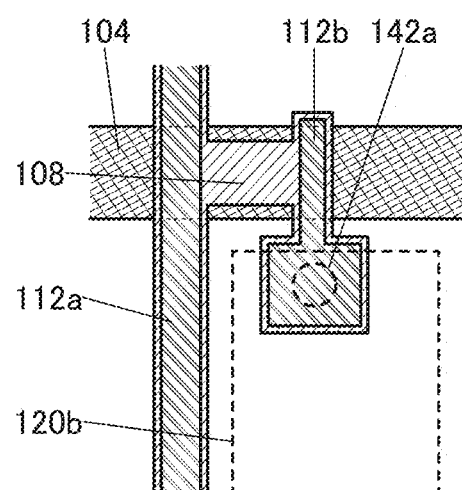
Figure 8C:
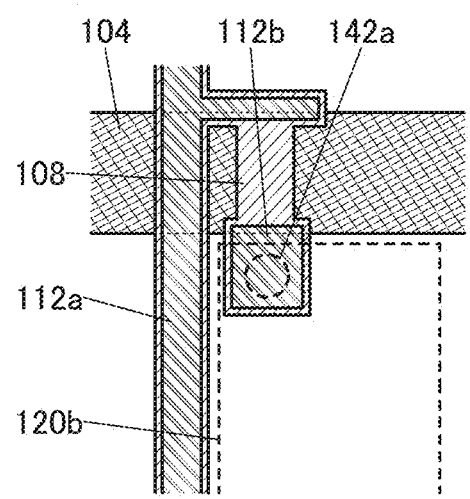

FIGS. 8(B) and 8(C) each show an example in which the conductive layer 104 does not have the sticking-out portion. FIG. 8(B) is an example in which the channel length direction of the semiconductor layer 108 is parallel to the extending direction of the conductive layer 104, and FIG. 8(C) is an example in which these directions are orthogonal to each other.

Figure 8D:
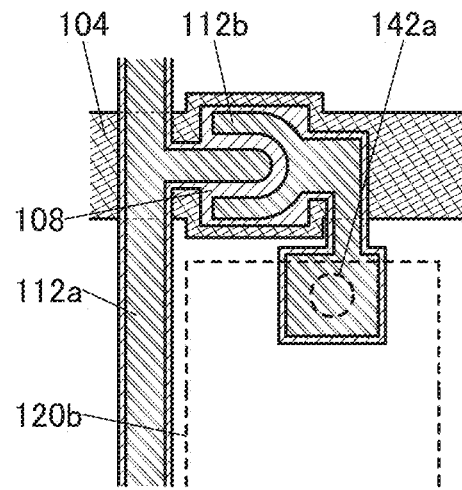
Figure 8E:
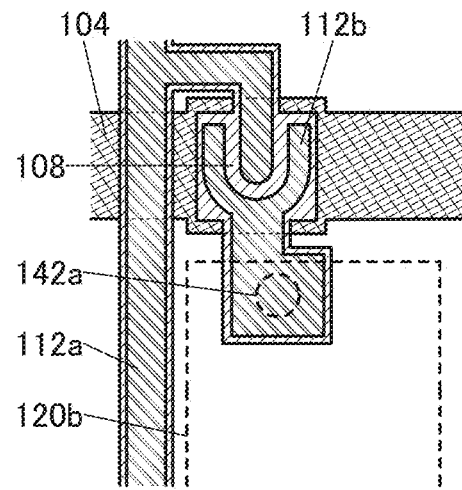

In FIGS. 8(D) and 8(E), the conductive layer 112b has a U-shaped top-view shape with a substantially arc-like portion. In addition, the conductive layer 112a and the conductive layer 112b are placed such that the distance between the conductive layer 112a and the conductive layer 112b is constant over the semiconductor layer 108. With such a structure, the transistor can have a larger channel width and make a larger amount of current flow.

Note that the transistor of one embodiment of the present invention can be used not only in a display device but also in a variety of circuits and devices. For example, the transistor of one embodiment of the present invention can be suitably used in various circuits in an IC chip mounted on an electronic device or the like, such as an arithmetic circuit, a memory circuit, a driver circuit, and an interface circuit. Alternatively, the transistor of one embodiment of the present invention can be suitably used in driver circuits for a display device in which a liquid crystal element, an organic EL element, or the like is used, for example. Alternatively, the transistor of one embodiment of the present invention can be suitably used in driver circuits for various sensor devices such as a touch sensor, an optical sensor, and a biosensor, for example.

The above is the description of the application example.

[Components of Semiconductor Device]

Components included in the semiconductor device of this embodiment will be described below in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 106]

The insulating layer 106 can be formed of a single layer or a stacked layer of an oxide insulating film or a nitride insulating film, for example. To improve the properties of the interface with the semiconductor layer 108, at least a region in the insulating layer 106 that is in contact with the semiconductor layer 108 is preferably formed of an oxide insulating film. Moreover, a film from which oxygen is released by heating is preferably used as the insulating layer 106.

For example, a single layer or a stacked layer using silicon oxide, silicon oxynitride, silicon nitride oxide, silicon nitride, aluminum oxide, hafnium oxide, gallium oxide, Ga—Zn oxide, or the like can be provided as the insulating layer 106.

In the case where a film other than an oxide film, such as a silicon nitride film, is used for the side of the insulating layer 106 that is in contact with the semiconductor layer 108, pretreatment such as oxygen plasma treatment is preferably performed on a surface in contact with the semiconductor layer 108 to oxidize the surface or the vicinity of the surface.

[Conductive Film]

Conductive films that constitute the semiconductor device, such as the conductive layer 104 and the conductive layer 120a that function as gate electrodes, 120b that functions as a wiring, the conductive layer 112a that functions as one of a source electrode or a drain electrode, and the conductive layer 112b that functions as the other can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the conductive layer 112a and the conductive layer 112b, in particular, a low-resistance conductive material containing copper, silver, gold, aluminum, or the like is preferably used. Copper or aluminum is particularly preferable because of its high mass-productivity.

For the conductive films that constitute the semiconductor device, an oxide conductor or a metal oxide film such as In—Sn oxide, In—W oxide, In—W—Zn oxide, In—Ti oxide, In—Ti—Sn oxide, In—Zn oxide, In—Sn—Si oxide, or In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive films that constitute the semiconductor device may each have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Moreover, a Cu—X alloy film (X is Mn, Ni, Cr, Fe, Co, Mo, Ta, or Ti) may be used for the conductive layer 104, the conductive layer 112a, and the conductive layer 112b. The use of a Cu—X alloy film enables the fabrication cost to be reduced because a wet etching process can be used in the processing.

[Insulating Layer 114 and Insulating Layer 116]

As the insulating layer 114 provided over the semiconductor layer 108, an insulating layer containing one or more kinds of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like formed by a PECVD method, a sputtering method, an ALD method, or the like can be used. It is particularly preferable to use a silicon oxide film or a silicon oxynitride film formed by a plasma CVD method. Note that the insulating layer 114 may have a stacked-layer structure of two or more layers.

As the insulating layer 116 functioning as a protective layer, an insulating layer containing one or more kinds of a silicon nitride oxide film, a silicon nitride film, an aluminum nitride film, an aluminum nitride oxide film, and the like formed by a PECVD method, a sputtering method, an ALD method, or the like can be used. Note that the insulating layer 116 may have a stacked-layer structure of two or more layers.

[Semiconductor Layer]

In the case where the semiconductor layer 108 is an In-M-Zn oxide, a sputtering target used for forming the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, which facilitates formation of the semiconductor layer 108 having crystallinity. Note that the atomic ratio in the semiconductor layer 108 to be formed may vary in the range of ±40% from any of the above atomic ratios of the metal elements contained in the sputtering target. For example, in the case where the composition of a sputtering target used for the semiconductor layer 108 is In:Ga:Zn=4:2:4.1[atomic ratio], the composition of the formed semiconductor layer 108 is sometimes in the neighborhood of In:Ga:Zn=4:2:3[atomic ratio].

Note that when the atomic ratio is described as In:Ga:Zn=4:2:3 or in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 108 is 2 eV or more, preferably 2.5 eV or more. With the use of such a metal oxide having a wider energy gap than silicon, the off-state current of the transistor can be reduced.

Furthermore, the semiconductor layer 108 preferably has a non-single-crystal structure. The non-single-crystal structure includes, for example, a CAAC structure which will be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. On the other hand, a clear grain boundary cannot be observed in the CAAC-OS; thus, it can be said that a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an InGaZnO$_4$ crystal having a YbFe$_2$O$_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the size of a crystal part. Meanwhile, in some cases, a circular (ring-like) region with high luminance is observed when electron diffraction (also referred to as nanobeam electron diffraction) using an electron beam with a probe diameter (e.g., 1 nm or larger and 30 nm or smaller) close to or smaller than the size of a crystal part is performed on the nc-OS film, and a plurality of spots are observed in the ring-like region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Accordingly, the nc-OS film has a higher carrier density and higher electron mobility than the CAAC-OS film in some cases. Therefore, a transistor including the nc-OS film may have high field-effect mobility.

The nc-OS film can be formed at a lower oxygen flow rate ratio in film formation than the CAAC-OS film. The nc-OS film can also be formed at a lower substrate temperature in film formation than the CAAC-OS film. For example, the nc-OS film can be formed at a relatively low substrate temperature (e.g., a temperature of 130° C. or lower) or without heating of the substrate and thus is suitable for a large glass substrate, a resin substrate, or the like, and productivity can be increased.

An example of a crystal structure of a metal oxide is described. Note that a metal oxide formed by a sputtering method using an In—Ga—Zn oxide target (In:Ga:Zn=4:2:4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated intentionally.

[Composition of Metal Oxide]

The composition of a CAC (Cloud-Aligned Composite)-OS that can be used in a transistor disclosed in one embodiment of the present invention will be described below.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. The conductive regions are observed to be coupled in a cloud-like manner with their boundaries blurred, in some cases.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of such a structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility, can be obtained.

In other words, the CAC-OS or the CAC-metal oxide can also be referred to as a matrix composite or a metal matrix composite.

The above is the description of the components.

At least part of this embodiment can be implemented in combination with the other embodiments described in this specification as appropriate.

Embodiment 2

In this embodiment, an example of a display device that includes any of the transistors described in the above embodiment will be described.

Structure Example

Figure 9A:
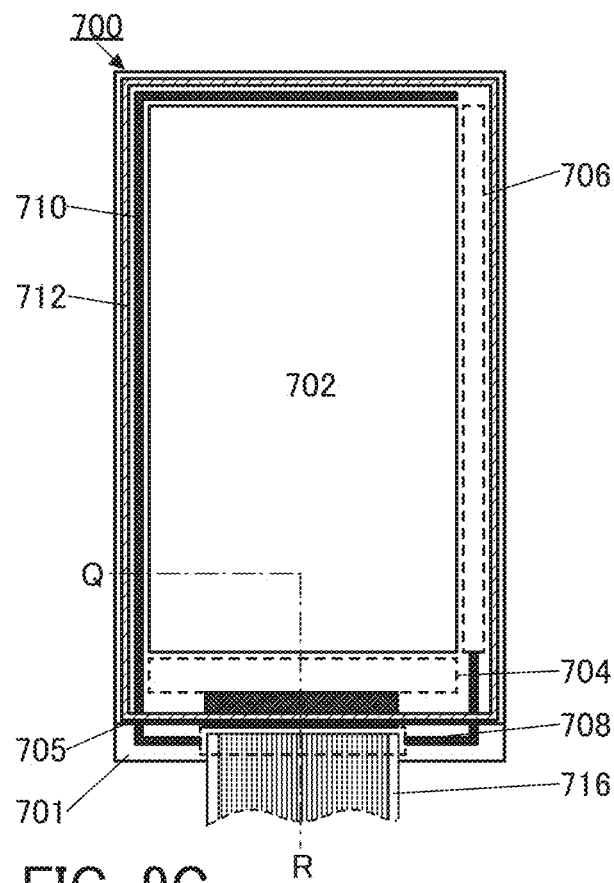
FIG. 9 (A), (B), (C) Top views of display devices.

FIG. 9(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for example.

Figure 9B:
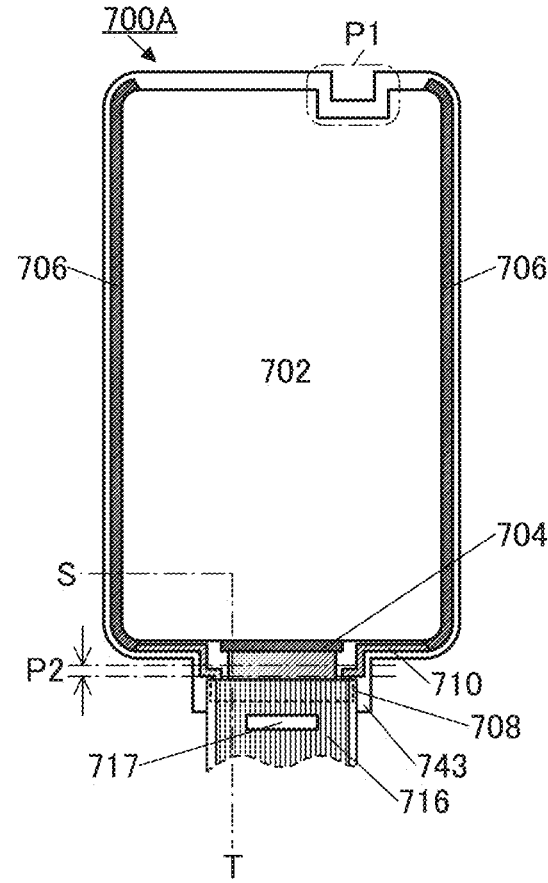

A display device 700A illustrated in FIG. 9(B) is an example of a display device that includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as shown in a region P1 in FIG. 9(B). A pair of gate driver circuit portions 706 is provided on the opposite sides with the pixel portion 702 therebetween. The gate driver circuit portions 706 are provided along an arc contour at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 9(B). When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

Figure 9C:
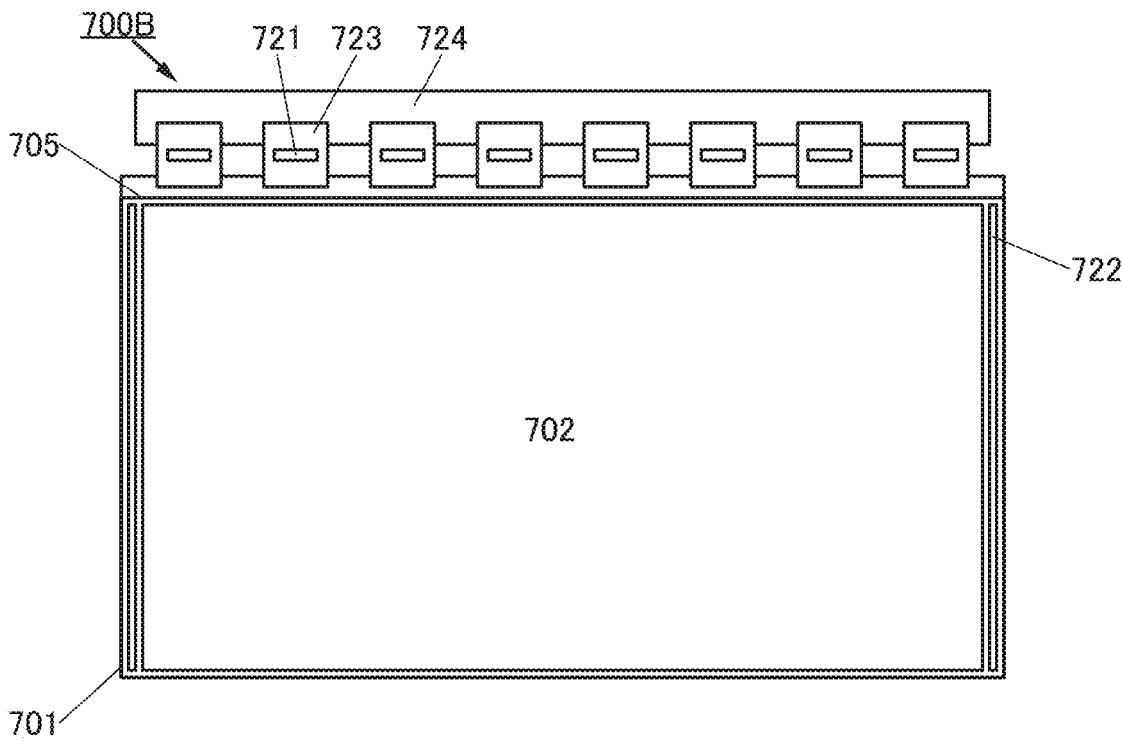

A display device 700B illustrated in FIG. 9(C) is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the substrate 701. Thus, an electronic device with a narrow bezel can be provided.

With such a structure, a large-size and high-resolution display device can be provided. For example, use in a display device with a screen diagonal of 30 inches or more, 40 inches or more, 50 inches or more, or 60 inches or more is possible. Furthermore, a display device with extremely high resolution such as 4K2K or 8K4K can be provided.

Cross-Sectional Structure Example

Figure 10:
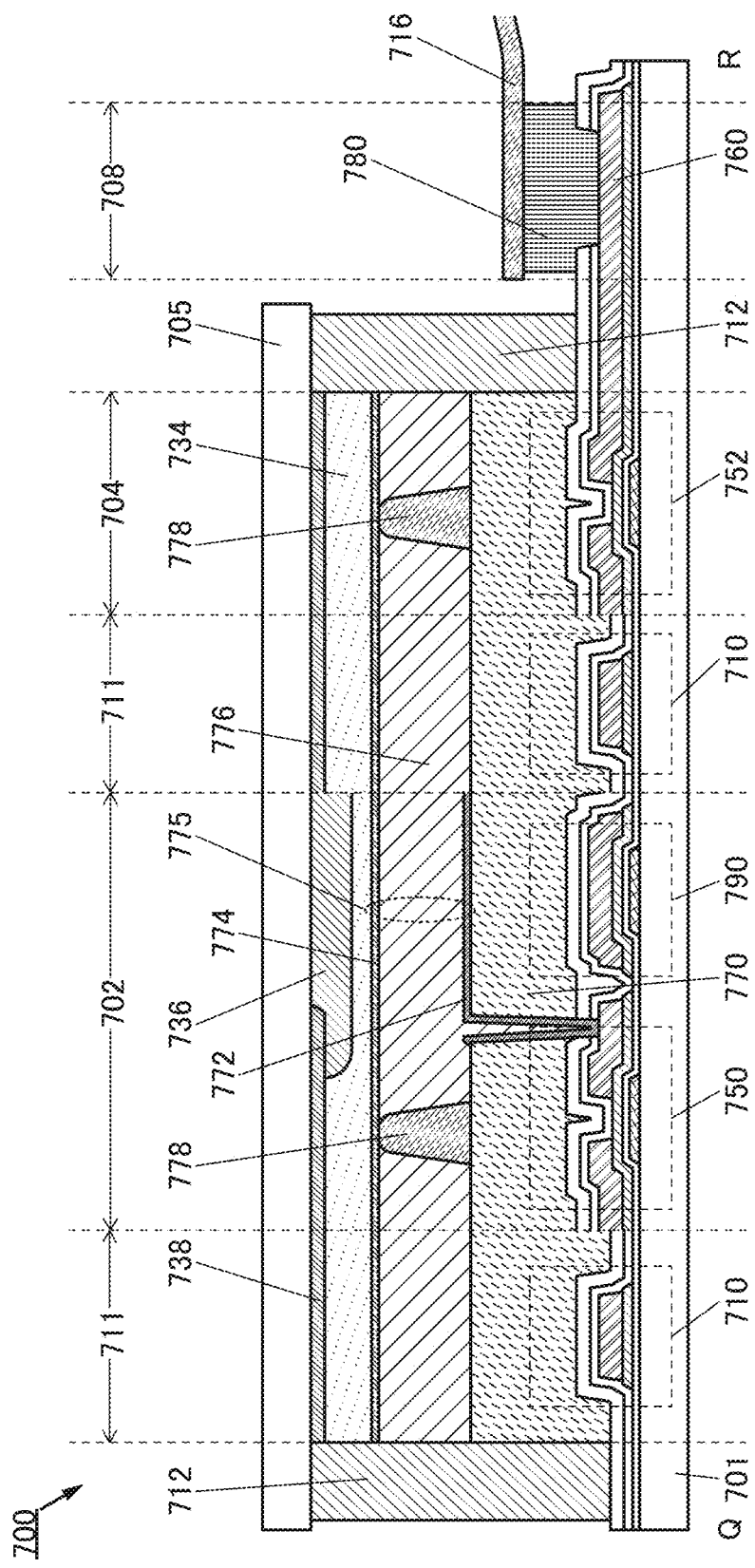
FIG. 10 A cross-sectional view of a display device.
Figure 11:
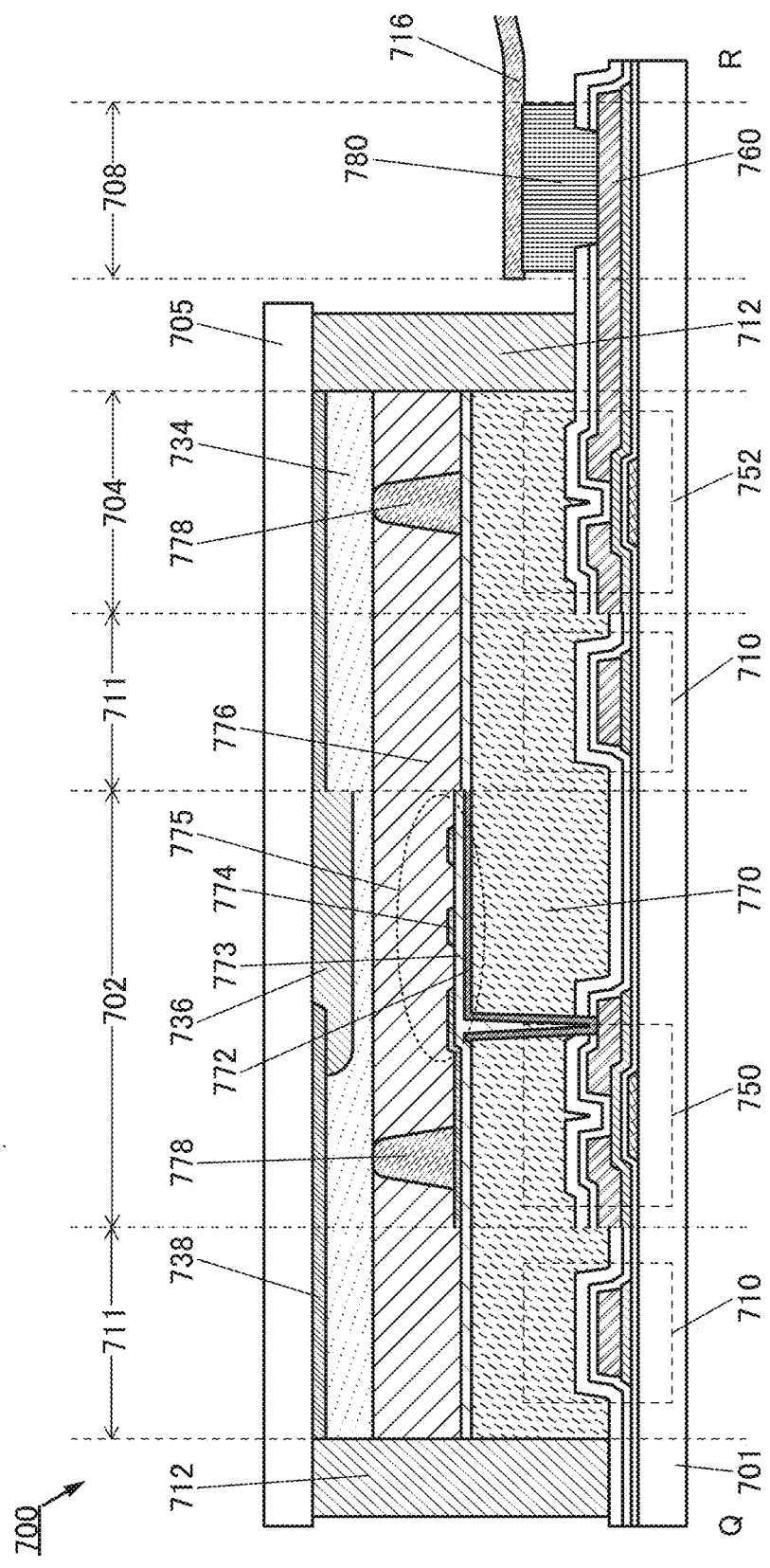
FIG. 11 A cross-sectional view of a display device.
Figure 12:
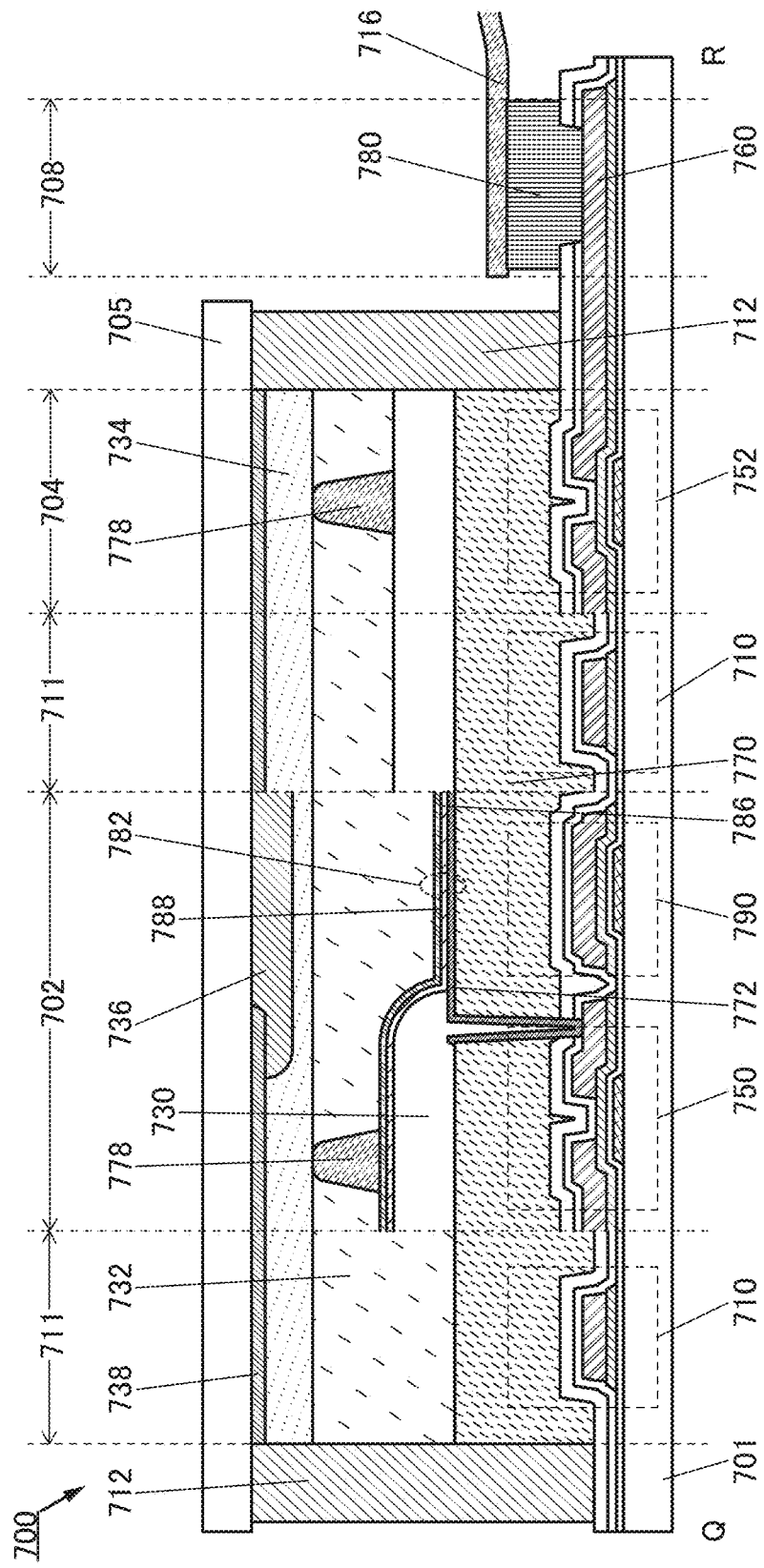
FIG. 12 A cross-sectional view of a display device.
Figure 13:
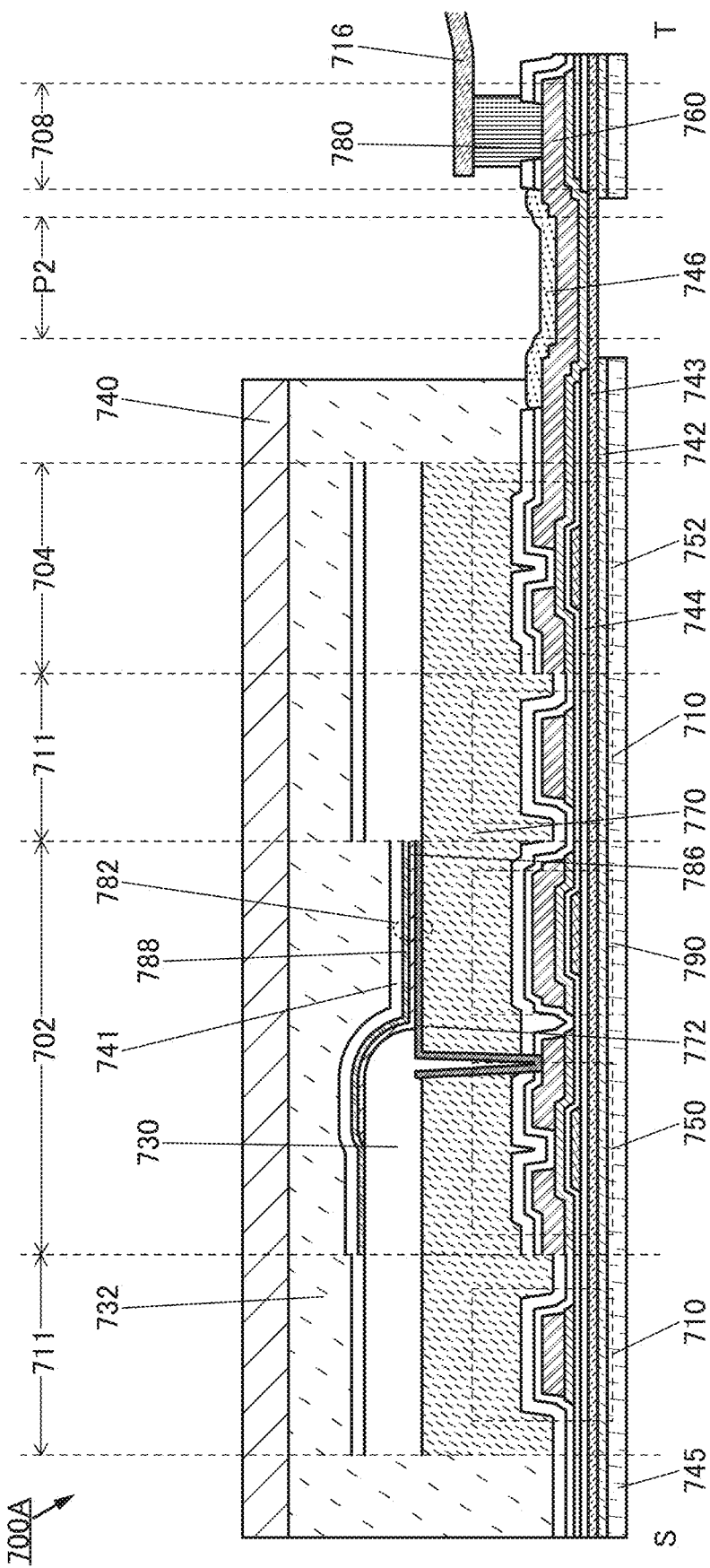
FIG. 13 A cross-sectional view of a display device.

Structures using a liquid crystal element or an EL element as a display element will be described below with reference to FIG. 10 to FIG. 13. Note that FIG. 10 to FIG. 12 are cross-sectional views taken along the dashed-dotted line Q-R in FIG. 9(A). FIG. 13 is a cross-sectional view taken along the dashed-dotted line S-T in the display device 700A in FIG. 9(B). FIG. 10 and FIG. 11 are each a structure using a liquid crystal element as a display element, and FIG. 12 and FIG. 13 are each a structure using an EL element.

[Description of Common Portions in Display Devices]

Display devices in FIG. 10 to FIG. 13 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 11 shows a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electric signal such as an image signal can be held for a longer period, and the interval between writes of an image signal or the like can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 10, FIG. 12, and FIG. 13 includes a lower electrode formed by processing the same film as the gate electrode of the transistor 750 and an upper electrode formed by processing the same conductive film as the source electrode or the drain electrode. Part of an insulating film functioning as a gate insulating layer of the transistor 750 is provided between the lower electrode and the upper electrode. That is, the capacitor 790 has a stacked-layer structure in which an insulating film functioning as a dielectric film is positioned between a pair of electrodes.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors, and a bottom-gate transistor may be used as the other. Note that the gate driver circuit portion 706 is similar to the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

[Structure Example of Display Device Using Liquid Crystal Element]

The display device 700 illustrated in FIG. 10 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. When a light-transmitting material is used for the conductive layer 772, the display device 700 is a transmissive liquid crystal display device. In the case of a reflective liquid crystal display device, a polarizing plate is provided on the viewer side. By contrast, in the case of a transmissive liquid crystal display device, a pair of polarizing plates is provided such that the liquid crystal element is placed therebetween.

The display device 700 in FIG. 11 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 11, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 10 and FIG. 11, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

As a mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as an improvement in the aperture ratio of each pixel and an increase in the resolution can be obtained because subpixels that emit light of, for example, R (red), G (green), and B (blue), need not be provided.

[Display Device Using Light-Emitting Element]

The display device 700 illustrated in FIG. 12 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 12, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 13 illustrates a structure of a display device that can be suitably used for a flexible display. FIG. 13 is a cross-sectional view taken along the dashed-dotted line S-T in the display device 700A in FIG. 12.

The display device 700A in FIG. 13 has a structure in which a support substrate 745, a bonding layer 742, the resin layer 743, and an insulating layer 744 are stacked instead of the substrate 701 in FIG. 12. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700 in FIG. 13 includes a protective layer 740 instead of the substrate 705 in FIG. 12. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 13 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When an inorganic insulating film is not provided in the region P2 that can be bent and only a conductive layer containing a metal or an alloy and a layer containing an organic material are stacked, generation of cracks at the time of bending can be prevented. When the support substrate 745 is not provided in the region P2, part of the display device 700A can be bent with an extremely small radius of curvature.

[Structure Example of Display Device Provided with Input Device]

An input device may be provided in the display device 700 illustrated in FIG. 10 to FIG. 13. Examples of the input device include a touch sensor.

A variety of types such as a capacitive type, a resistive type, a surface acoustic wave type, an infrared type, an optical type, and a pressure-sensitive type can be used as the sensor type, for example. Alternatively, a combination of two or more of these types may be employed.

Examples of the touch panel structure include what is called an in-cell touch panel in which an input device is provided inside a pair of substrates, what is called an on-cell touch panel in which an input device is formed over the display device 700, and what is called an out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention will be described with reference to FIG. 14(A), FIG. 14(B), and FIG. 14(C).

Figure 14A:
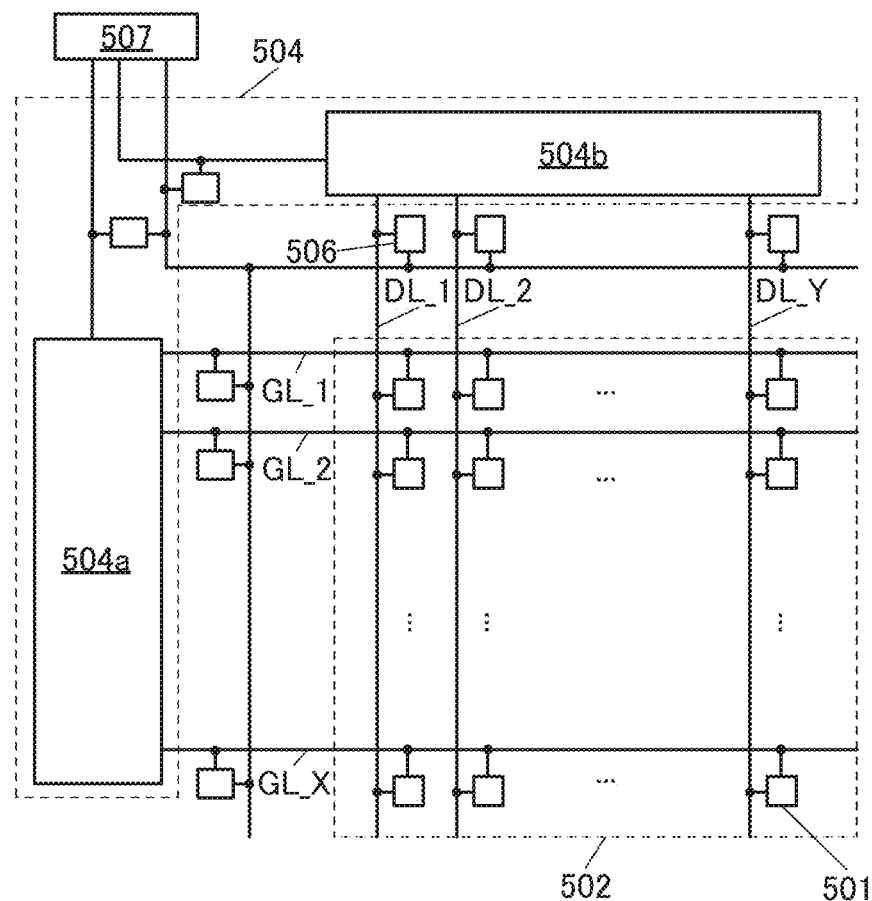
FIG. 14 (A) A block diagram of a display device. (B), (C) Circuit diagrams of a display device.

A display device illustrated in FIG. 14(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that makes, when a potential out of a certain range is applied to a wiring connected to the protection circuit, the wiring and another wiring be in a conduction state. The protection circuit 506 illustrated in FIG. 14(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figures 14B, 14C:
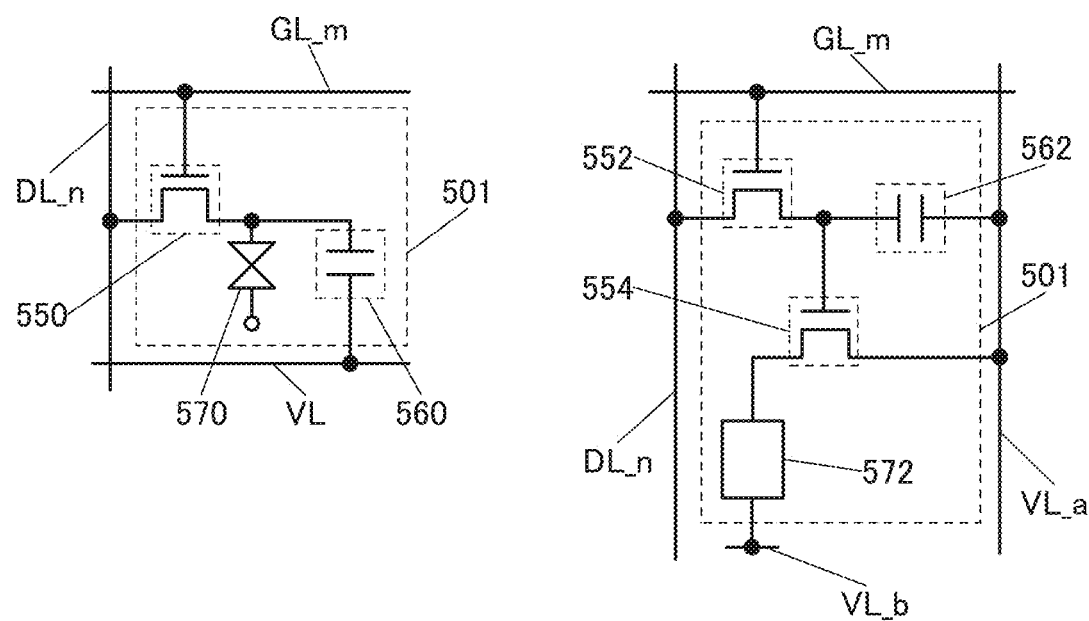

The plurality of pixel circuits 501 illustrated in FIG. 14(A) can have a configuration illustrated in FIG. 14(B) or FIG. 14(C), for example.

The pixel circuit 501 illustrated in FIG. 14(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 14(C) includes transistors 552 and 554, a capacitor 562, and a light-emitting element 572. The data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

[Circuit Configuration]

Figure 15A:
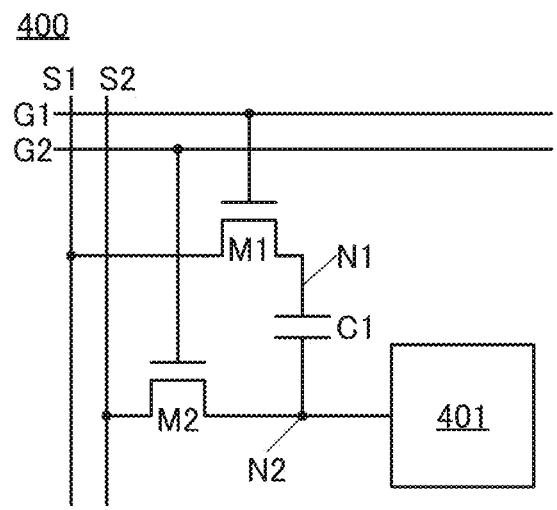
FIG. 15 (A), (C), (D) Circuit diagrams of display devices. (B) A timing chart for a display device.

FIG. 15(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS element, or the like can be used.

A node connecting the transistor M1 and the capacitor C1 is denoted as N1, and a node connecting the transistor M2 and the circuit 401 is denoted as N2.

In the pixel circuit 400, the potential of the node N1 can be held when the transistor M1 is turned off. The potential of the node N2 can be held when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be held for a long time. Note that in the case where the period in which the potential of each node is held is short (specifically, the case where the frame frequency is higher than or equal to 30 Hz, for example), a transistor using a semiconductor such as silicon may be used.

Driving Method Example

Figure 15B:
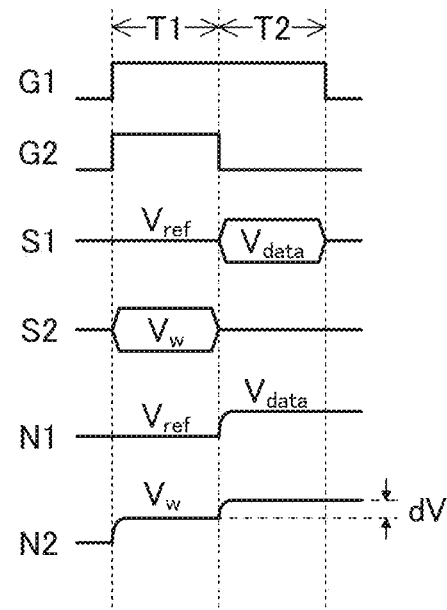

Next, an example of a method for operating the pixel circuit 400 is described with reference to FIG. 15(B). FIG. 15(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 15(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is held in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 15(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Example

[Example Using Liquid Crystal Element]

Figure 15C:
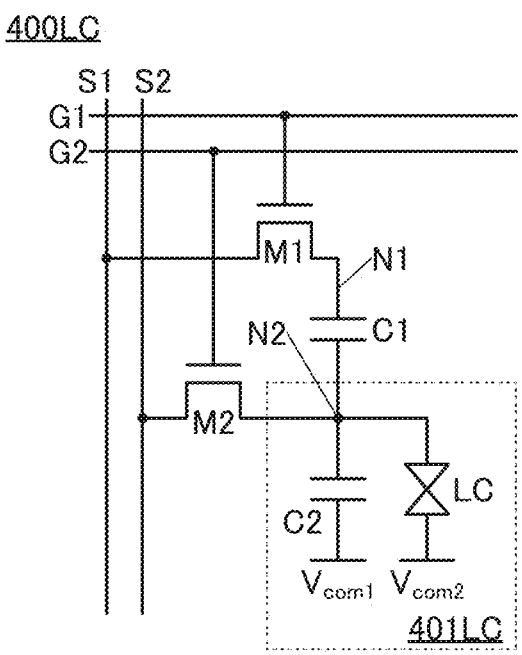

A pixel circuit 400LC illustrated in FIG. 15(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

Figure 15D:
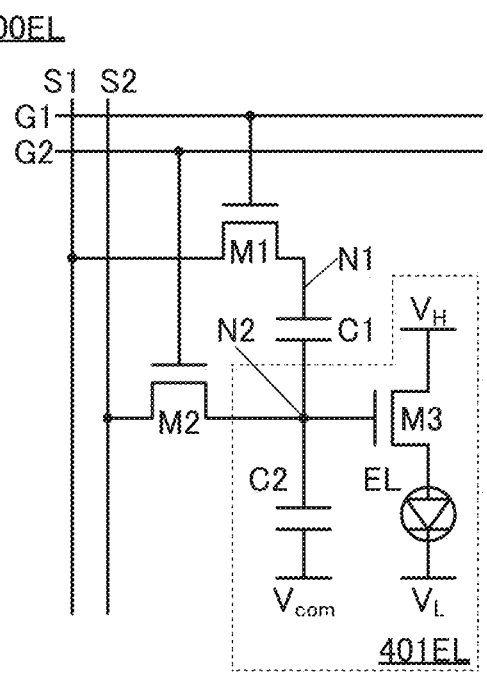

A pixel circuit 400EL illustrated in FIG. 15(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits illustrated in FIGS. 15(C) and 15(D), and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention will be described.

Figure 16A:
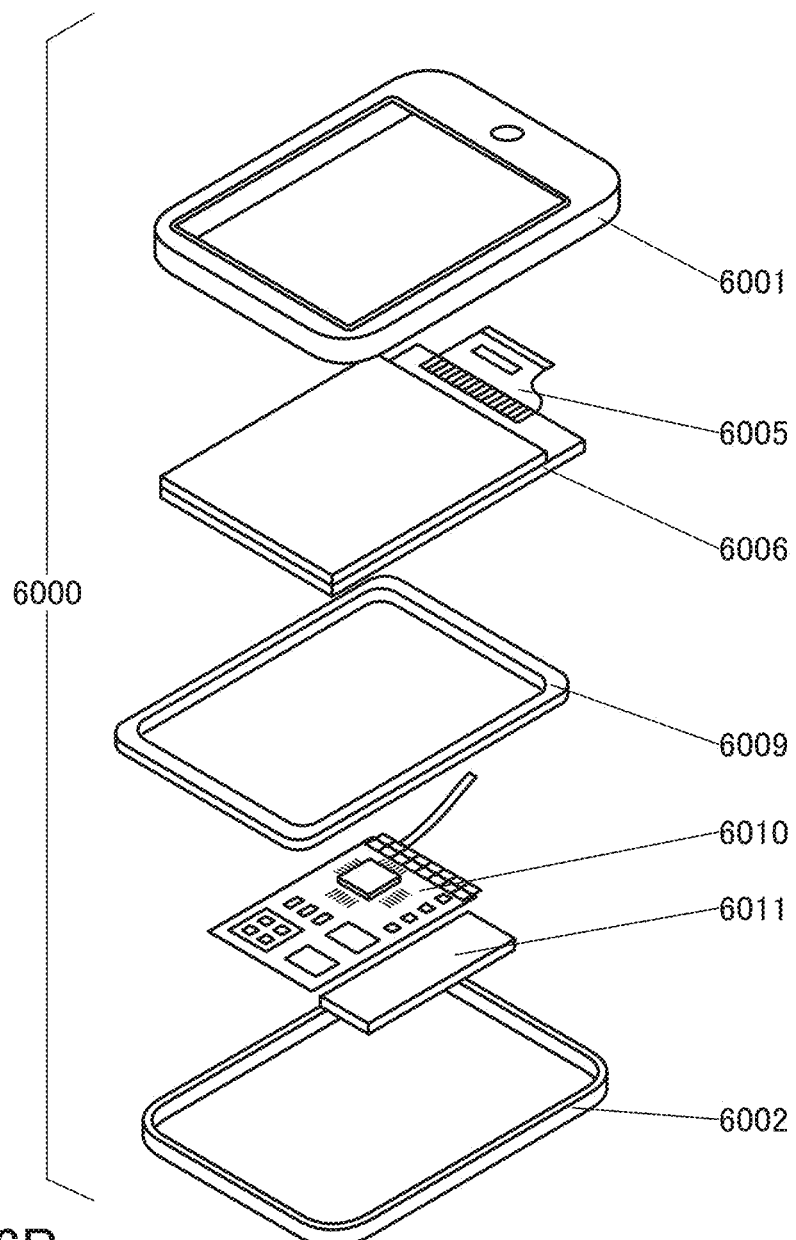
FIG. 16 (A), (B) A structure example of a display module.

In a display module 6000 illustrated in FIG. 16(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shapes and sizes of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. As a power source for supplying power to the power supply circuit, power from the battery 6011 may be used.

Figure 16B:
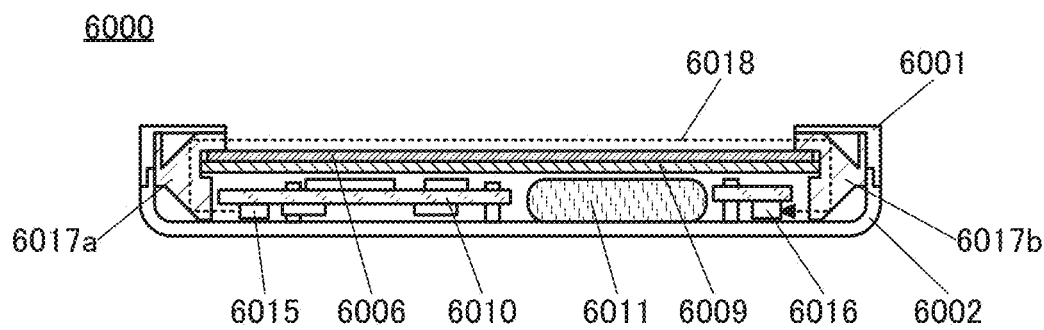

FIG. 16(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 6

In this embodiment, examples of an electronic device for which the display device of one embodiment of the present invention can be used will be described.

Figure 17A:
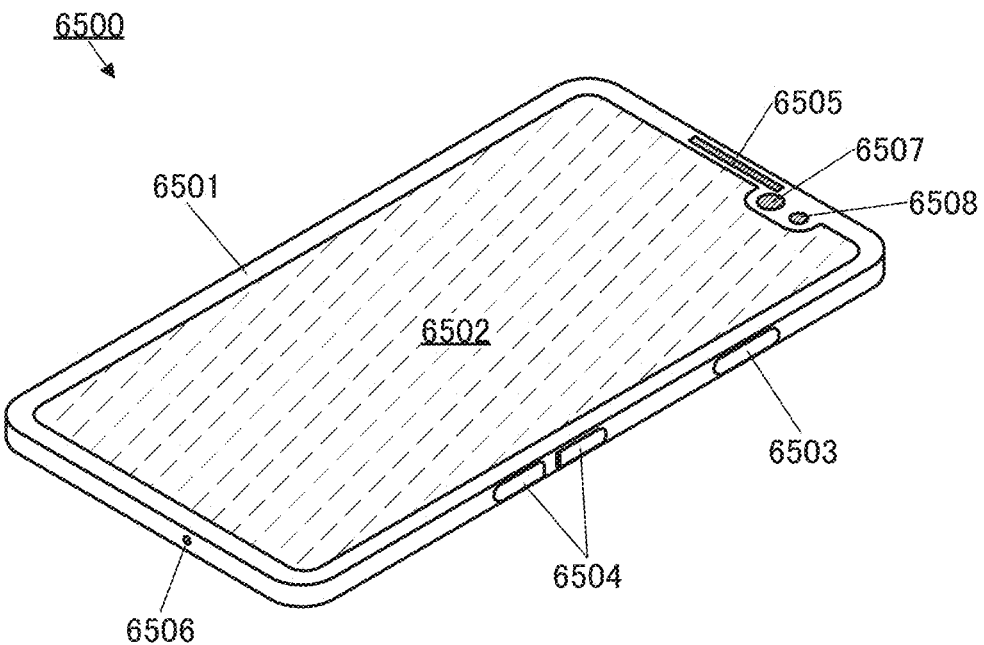
FIG. 17 (A), (B) A structure example of an electronic device.

An electronic device 6500 illustrated in FIG. 17(A) is a portable information terminal that can be used as a smartphone.

The electronic device 6500 includes, in a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 17B:
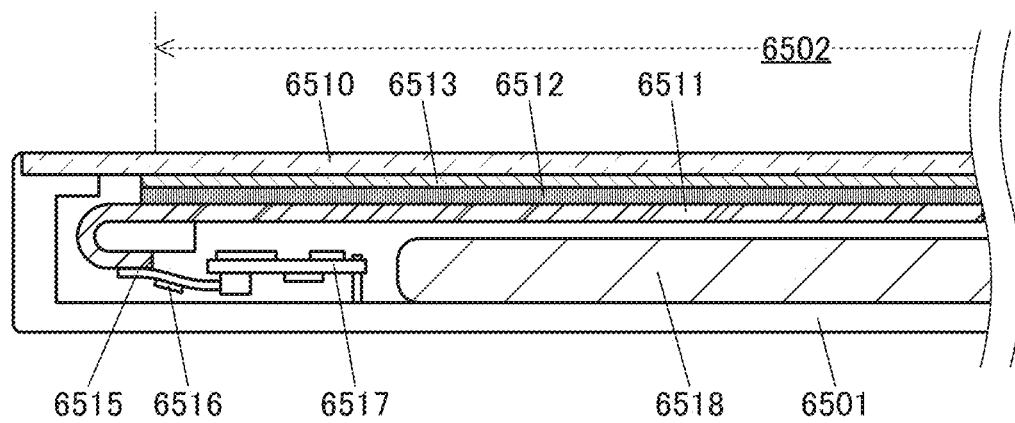

FIG. 17(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 7

In this embodiment, electronic devices each including a display device fabricated using one embodiment of the present invention will be described.

Electronic devices shown below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

Figure 18A:
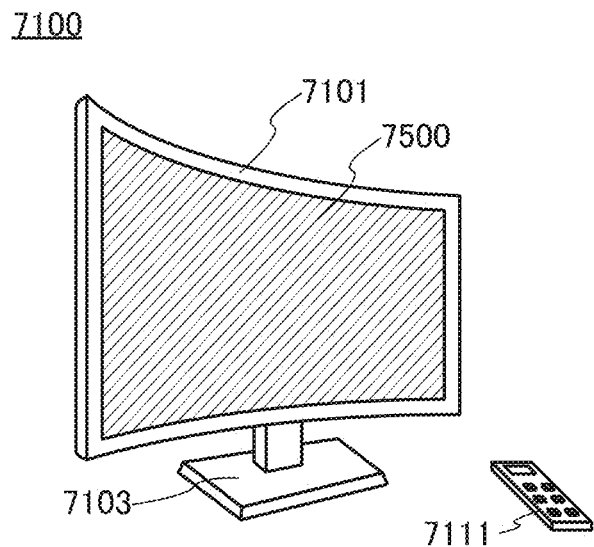
FIG. 18 (A), (B), (C), (D) Structure examples of electronic devices.

FIG. 18(A) illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 18(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 18B:
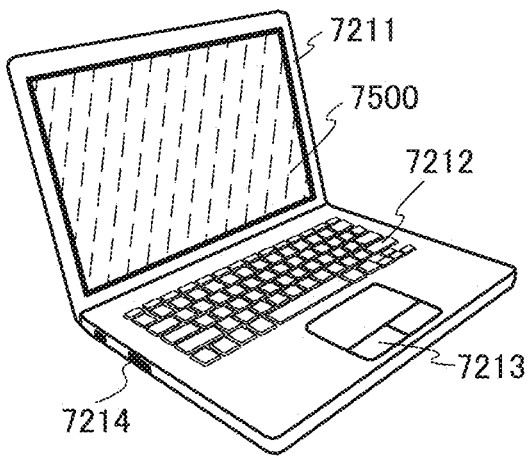

FIG. 18(B) illustrates a laptop personal computer 7200. The laptop personal computer 7200 includes a housing 7211, a keyboard 7212, a pointing device 7213, an external connection port 7214, and the like. The display portion 7500 is incorporated in the housing 7211.

Figure 18C:
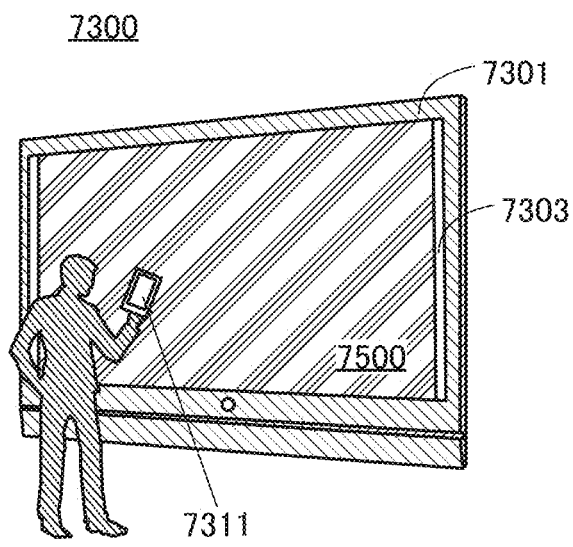
Figure 18D:
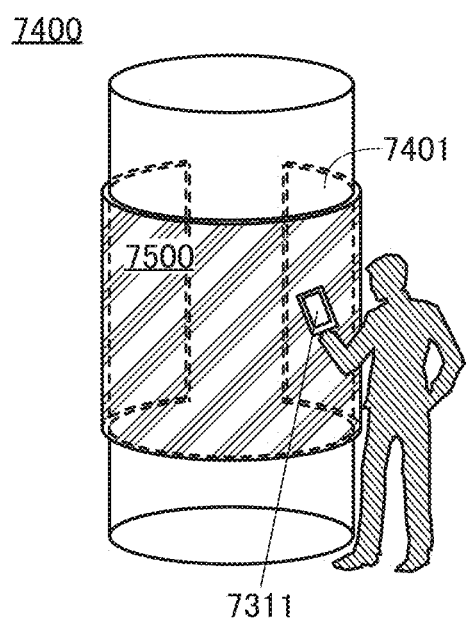

FIGS. 18(C) and 18(D) illustrate examples of digital signage.

Digital signage 7300 illustrated in FIG. 18(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 18(D) is digital signage 7400 attached to a cylindrical pillar 7401. The digital signage 7400 includes the display portion 7500 provided along a curved surface of the pillar 7401.

A larger display portion 7500 can increase the amount of information that can be provided at a time and attracts more attention, so that the effectiveness of the advertisement can be increased, for example.

A touch panel is preferably used in the display portion 7500 so that the user can operate the digital signage. Thus, the digital signage can be used not only for advertising but also for providing information that the user needs, such as route information, traffic information, and an information map of a commercial facility.

As illustrated in FIGS. 18(C) and 18(D), it is preferable that the digital signage 7300 or the digital signage 7400 can work with an information terminal 7311, such as a user's smartphone, through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 18(A) to 18(D).

The electronic devices of this embodiment each include a display portion; however, one embodiment of the present invention can also be used for an electronic device without a display portion.

At least part of this embodiment can be implemented in combination with the other embodiments described in this specification as appropriate.

[Example]

In this example, a transistor of one embodiment of the present invention was fabricated, its cross section was observed, and its electrical characteristics were evaluated.

[Fabrication of Sample]

Here, two kinds of samples, Sample A and a comparative sample, were fabricated. Sample A was fabricated in such a manner that a source electrode and a drain electrode were formed over a metal oxide film to be a semiconductor layer and then the metal oxide film was etched to form the semiconductor layer. The comparative sample was fabricated in such a manner that a conductive film to be a source electrode and a drain electrode was formed after an island-shaped semiconductor layer was formed, and the conductive film was processed to form the source electrode and the drain electrode.

[Sample A]

An approximately 100-nm-thick tungsten film was used as a first gate electrode over a glass substrate. An approximately 400-nm-thick silicon nitride film and an approximately 5-nm-thick silicon oxynitride film were used as a gate insulating layer covering the gate electrode.

Next, an approximately 20-nm-thick first metal oxide film and an approximately 15-nm-thick second metal oxide film were formed to be stacked over the gate insulating layer by a sputtering method. The first metal oxide film and the second metal oxide film were each formed using a metal oxide target with In:Ga:Zn=4:2:4.1 [atomic ratio] as a sputtering target.

Next, the source electrode and the drain electrode were formed. First, an approximately 50-nm-thick tungsten film, an approximately 30-nm-thick first titanium film, and an approximately 200-nm-thick copper film were formed by a sputtering method. Next, a resist mask was formed and then only the copper film was etched by a wet etching method. Then, an approximately 100-nm-thick second titanium film was formed over the copper film and the exposed first titanium film by a sputtering method. At this time, the copper film was surrounded by the first titanium film and the second titanium film. Next, in a region outside the end portion of the copper film, the second titanium film, the first titanium film, and the tungsten film were etched by a dry etching method using an $SF_6$ gas and an $O_2$ gas, and successively, the etching residue of the conductive film was removed and the vicinity of the top surface of the second metal oxide film was slightly etched by a dry etching method using an $SF_6$ gas and a $BCl_3$ gas. In this manner, the source electrode and the drain electrode each having a structure in which the copper film was covered with the two-layer titanium films were obtained.

After that, a resist mask was formed to cover the source electrode, the drain electrode, and a portion to be the semiconductor layer. The resist mask was formed to cover the top surfaces and the side surfaces of the source electrode and the drain electrode. Then, the first metal oxide film and the second metal oxide film were etched using the resist mask, whereby the semiconductor layer was formed and the gate insulating layer was partly exposed. The etching was performed by a wet etching method using an aqueous solution containing nitric acid, acetic acid, and phosphoric acid.

Next, an approximately 400-nm-thick silicon oxynitride film was formed as a first protective layer by a PECVD method, and heat treatment was performed at 350° C. for 1 hour in a nitrogen atmosphere. Then, as a second protective layer, an approximately 100-nm-thick silicon nitride film and an approximately 30-nm-thick silicon oxynitride film were stacked by a PECVD method.

Next, after an opening reaching the first gate electrode was formed, an approximately 100-nm-thick indium tin oxide film containing silicon was formed and then processed to form a second gate electrode. Here, the second gate electrode was electrically connected to the first gate electrode through the opening.

Lastly, an approximately 1.5-µm-thick acrylic film was formed as a planarization layer and then heat treatment was performed at 250° C. for 1 hour in a nitrogen atmosphere.

Through the above steps, Sample A including the transistor over the glass substrate was obtained.

[Comparative Sample]

First, a first gate electrode and a gate insulating layer were formed in a manner similar to the above. Next, a stack of a first metal oxide film and a second metal oxide film was formed over the first gate insulating layer and then was partly etched to form an island-shaped semiconductor layer and to expose part of the gate insulating layer.

Then, the conductive film to be the source electrode and the drain electrode was formed over the semiconductor layer and the gate insulating layer in a manner similar to the above, and the conductive film was partly etched to form the source electrode and the drain electrode.

For the following steps, refer to the above description. That is, a first protective layer, a second protective layer, a second gate electrode, and a planarization layer were sequentially formed. Note that as the second protective layer, a single layer of an approximately 100-nm-thick silicon nitride film was used.

Through the above steps, the comparative sample including the transistor over the glass substrate was obtained.

[Cross-Sectional Observation]

The cross sections of Sample A and the comparative sample fabricated above were observed with scanning transmission electron microscopy (STEM).

Figures 19A, 19B:
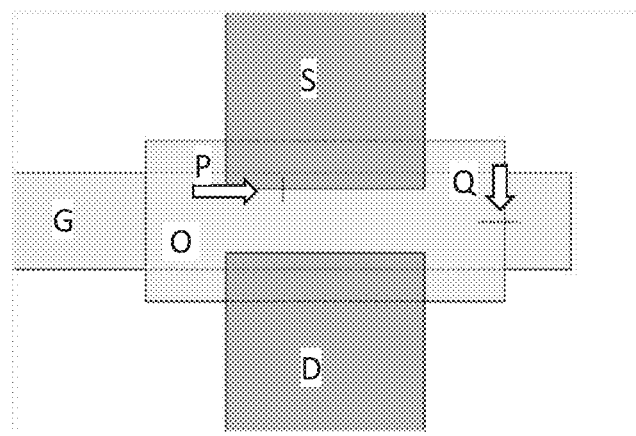
FIG. 19 (A) A schematic view illustrating observation positions of transistors. (B) Cross-sectional observation images of transistors.

FIG. 19(A) shows a schematic view for illustrating points subjected to cross-sectional observation. FIG. 19(A) shows the positional relationship between the source electrode (S), the drain electrode (D), the first gate electrode (G), and the semiconductor layer (OS). An observation point P is a region including the end portion of the source electrode (S) that is positioned over the first gate electrode (G), and shows a portion where the tungsten film and the two-layer titanium films are stacked. An observation point Q is a region including the end portion of the semiconductor layer (OS) that is positioned over the first gate electrode (G).

FIG. 19(B) shows cross-sectional observation images of the observation points. It was found in the observation point P that a large difference between Sample A and the comparative sample was not observed, and they had favorable shapes. On the other hand, it was found in the observation point Q that the exposed region of the gate insulating layer (GI) was hardly etched in Sample A, whereas the gate insulating layer (GI) in a portion not covered with the semiconductor layer (OS) was etched and its thickness was reduced in the comparative sample.

It was also found in the comparative sample that a step at the end portion of the semiconductor layer (OS) was not covered with the protective insulating layer (PA), and a low-density region (void) reaching the semiconductor layer (OS) was formed in the protective insulating layer (PA). By contrast, in Sample A, the semiconductor layer (OS) and the gate insulating layer (GI) were favorably covered with the protective insulating layer (PA); thus, a low-density region was not observed.

The shape defects of the gate insulating layer in the comparative sample were presumed to be caused by the etching of the exposed gate insulating layer at the time of etching the source electrode and the drain electrode (specifically, at the time of etching the titanium film and the tungsten film) because the conditions where the semiconductor layer was unlikely to be etched were prioritized.

By contrast, in Sample A, the gate insulating layer is not exposed at the time of etching the source electrode and the drain electrode, and a wet etching method by which the gate insulating layer is unlikely to be etched can be used at the time of the etching for forming the semiconductor layer; thus, the shape defects of the gate insulating layer as in the comparative sample are not observed and the gate insulating layer can be processed into a favorable shape.

[Id-Vg Characteristics of Transistor]

Next, the Id-Vg characteristics of the fabricated transistors were measured.

As conditions for measuring the Id-Vg characteristics of the transistors, voltage applied to the first gate electrode (hereinafter, also referred to as gate voltage (Vg)) and voltage applied to the second gate electrode (also referred to as gate electrode Vbg) were applied from −15 V to +20 V in steps of 0.25 V. In addition, voltage applied to the source electrode (hereinafter, also referred to as source voltage (Vs)) was 0 V (comm), and voltage applied to the drain electrode (hereinafter, also referred to as drain voltage (Vd)) was 0.1 V and 20 V.

Here, the Id-Vg characteristics before and after a pressure cooker test (PCT) were measured. In the PCT test, Sample A and the comparative sample were held for 12 hours under the conditions where the temperature was 130° C., the humidity was 85%, and the pressure was 0.2 MPa.

Figure 20A:
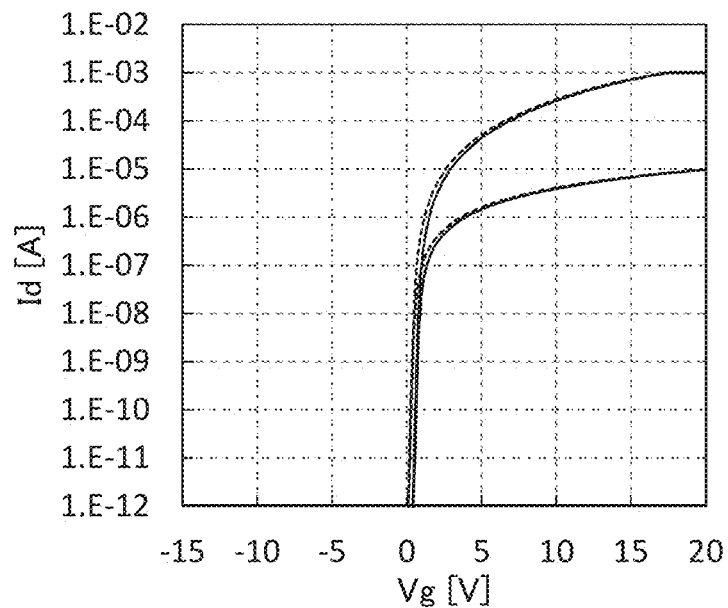
FIG. 20 (A), (B) Electrical characteristics of transistors.
Figure 20B:
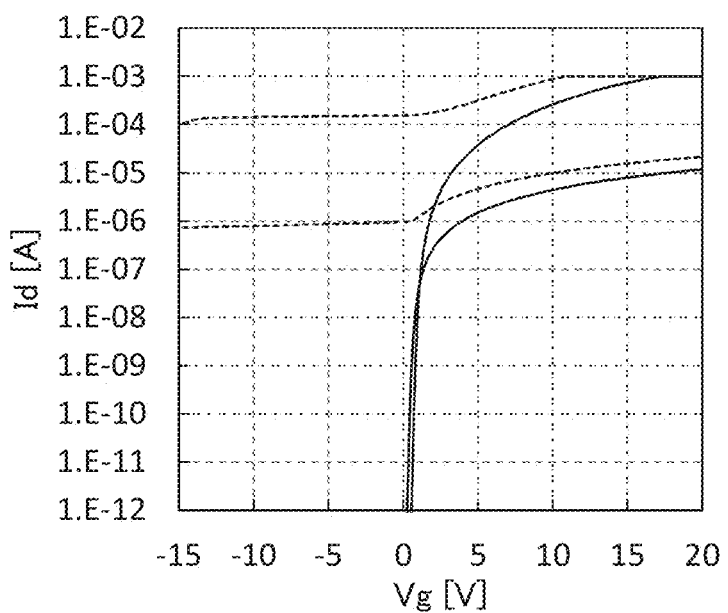

FIG. 20(A) shows the Id-Vg characteristics of Sample A, and FIG. 20(B) shows the Id-Vg characteristics of the comparative sample. In each graph, the results before the PCT test are shown by solid lines, and the results after the test are shown by dashed lines.

FIG. 20(A) reveals that the characteristics of Sample A hardly change before and after the PCT test, and Sample A has high reliability. It is also revealed that Sample A has excellent normally-off electrical characteristics before and after the PCT test.

On the other hand, FIG. 20(B) reveals that the characteristics of the comparative sample before the PCT test are excellent; however, the off-state current increases and the threshold voltage largely shifts in the negative direction after the PCT test. This is presumed to be because the low-density region reaching the semiconductor layer is formed in the protective insulating layer as described above and thus moisture is diffused into the semiconductor layer through this portion in the PCT test.

The above results demonstrate that the transistor fabricated by the fabrication method of one embodiment of the present invention has favorable electrical characteristics and extremely high reliability.

Reference Numerals

100, 100A to 100D: transistor, 100x: intersection portion, 102: substrate, 104: conductive layer, 106: insulating layer, 108: semiconductor layer, 108a, 108b: semiconductor layer, 108af, 108bf: metal oxide film, 112a, 112b: conductive layer, 113a to 113c: conductive layer, 113af to 113cf: conductive film, 114, 116: insulating layer, 115, 117: resist mask, 120a, 120b: conductive layer, 142a, 142b: opening portion

The invention claimed is:

1. A semiconductor device comprising:
a gate electrode over a substrate;
a gate insulating layer over the gate electrode;
a semiconductor layer over the gate insulating layer;
a source electrode over the semiconductor layer; and
a drain electrode over the semiconductor layer,
wherein, in plan view, all ends of the source electrode are located inside an outline of the semiconductor layer in a region where the source electrode does not overlap the gate electrode.

2. The semiconductor device according to claim 1, wherein a width in a channel width direction of a region of the semiconductor layer that overlaps with the gate electrode and does not overlap with the source electrode or the drain electrode is smaller than a width in a channel width direction of a portion of one of the source electrode and the drain electrode that overlaps with the gate electrode.

3. The semiconductor device according to claim 1, wherein the semiconductor layer is an oxide semiconductor layer.

4. A semiconductor device comprising:
a gate electrode over a substrate;
a gate insulating layer over the gate electrode;
a semiconductor layer over the gate insulating layer;
a source electrode over the semiconductor layer; and
a drain electrode over the semiconductor layer,
wherein, in plan view, all ends of the drain electrode are located inside an outline of the semiconductor layer in a region where the drain electrode does not overlap the gate electrode.

5. The semiconductor device according to claim 4, wherein a width in a channel width direction of a region of the semiconductor layer that overlaps with the gate electrode and does not overlap with the source electrode or the drain electrode is smaller than a width in a channel width direction of a portion of one of the source electrode and the drain electrode that overlaps with the gate electrode.

6. The semiconductor device according to claim 4, wherein the semiconductor layer is an oxide semiconductor layer.

* * * * *